US007012283B2

(12) United States Patent
Tsuda et al.

(10) Patent No.: US 7,012,283 B2
(45) Date of Patent: Mar. 14, 2006

(54) NITRIDE SEMICONDUCTOR LIGHT EMITTING ELEMENT AND OPTICAL DEVICE CONTAINING IT

(75) Inventors: Yuhzoh Tsuda, Nara (JP); Shigetoshi Ito, Nara (JP); Masahiro Araki, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 96 days.

(21) Appl. No.: 10/381,113

(22) PCT Filed: Sep. 17, 2001

(86) PCT No.: PCT/JP01/08083

§ 371 (c)(1),
(2), (4) Date: Mar. 20, 2003

(87) PCT Pub. No.: WO02/25746

PCT Pub. Date: Mar. 28, 2002

(65) Prior Publication Data

US 2004/0026710 A1    Feb. 12, 2004

(30) Foreign Application Priority Data

Sep. 21, 2000 (JP) .................................. 2000-287291
Nov. 17, 2000 (JP) .................................. 2000-351003

(51) Int. Cl.
  *H01L 29/06*  (2006.01)

(52) U.S. Cl. ................... 257/103; 257/96; 257/102; 257/97; 257/104; 257/14; 257/17

(58) Field of Classification Search ............ 257/103, 257/107, 104, 96, 97, 14, 17, 79, 25, 80, 257/81, 77, 78

See application file for complete search history.

(56) References Cited

U.S. PATENT DOCUMENTS

| 5,606,178 | A | * | 2/1997 | Schulman et al. ............ 257/25 |
| 6,028,874 | A | * | 2/2000 | Wada et al. .................. 374/45 |
| 6,072,197 | A | * | 6/2000 | Horino et al. ............. 257/103 |
| 6,162,656 | A | * | 12/2000 | Kunisato et al. ............. 438/46 |
| 6,163,038 | A | * | 12/2000 | Chen et al. ................ 257/103 |
| 6,399,966 | B1 |   | 6/2002 | Tsuda et al. |
| 6,423,984 | B1 | * | 7/2002 | Kato et al. .................. 257/103 |

(Continued)

FOREIGN PATENT DOCUMENTS

EP        0952645 A2    10/1999
JP        08316581 A    11/1996

(Continued)

OTHER PUBLICATIONS

Sakai, S. et al. (1998). "Green Light Emission from GaIn-NAs/GaN Multiple Quantum Well," *Japanese Journal of Applied Physics* 37, Part 2(12B):L1508.

*Primary Examiner*—Nathan Flynn
*Assistant Examiner*—Fazli Erdem
(74) *Attorney, Agent, or Firm*—Morrison & Foerster LLP

(57) ABSTRACT

According to an aspect of the present invention, a nitride semiconductor light emitting device includes a light emitting layer (106) having a quantum well structure with quantum well layers and barrier layers laminated alternately. The well layer is formed of a nitride semiconductor containing In, and the barrier layer is formed of a nitride semiconductor layer containing As, P or Sb. According to another aspect of the present invention, a nitride semiconductor light emitting device includes a light emitting layer having a quantum well structure with quantum well layers and barrier layers laminated alternately. The well layer is formed of $GaN_{1-x-y-z}As_xP_ySb_z$ ($0<x+y+z\leq0.3$), and the barrier layer is formed of a nitride semiconductor containing In.

46 Claims, 22 Drawing Sheets

U.S. PATENT DOCUMENTS

| | | | | |
|---|---|---|---|---|
| 6,555,403 | B1 * | 4/2003 | Domen et al. | 438/22 |
| 6,803,596 | B1 * | 10/2004 | Hata | 257/13 |
| 2001/0002048 | A1 | 5/2001 | Koike et al. | |
| 2002/0158249 | A1 | 10/2002 | Tsuda et al. | |
| 2003/0001168 | A1 | 1/2003 | Tsuda et al. | |

FOREIGN PATENT DOCUMENTS

| | | | |
|---|---|---|---|
| JP | 10223983 | * | 8/1998 |
| JP | 10242585 | | 9/1998 |
| JP | 10270804 | A | 10/1998 |
| JP | 11074622 | A | 3/1999 |
| JP | 11150294 | A | 6/1999 |
| JP | 11204880 | A | 7/1999 |
| JP | 11284282 | A | 10/1999 |
| JP | 2000183399 | A | 6/2000 |
| JP | 2000244013 | A | 9/2000 |

* cited by examiner

<1-100>

<11-20>

<1-100> DIRECTION WITH RESPECT TO SUBSTRATE

NITRIDE SEMICONDUCTOR LIGHT EMITTING ELEMENT AND OPTICAL DEVICE CONTAINING IT

CROSS-REFERENCE TO RELATED APPLICATIONS

This application is a National Phase under 35 U.S.C. § 371 of International Application No. PCT/JP01/08083 filed on Sep. 17, 2001 which claims priority to Japanese Patent Application No. 2000-287291 filed on Sep. 21, 2000, and Japanese Patent Application No. 2000-351003 filed on Nov. 17, 2000, the contents of each of which are incorporated herein by reference in their entirety.

TECHNICAL FIELD

The present invention relates to a nitride semiconductor light emitting device with high luminous efficiency and an optical apparatus using the same.

BACKGROUND ART

Conventionally, nitride semiconductor has been utilized or studied for a light emitting device and a high-power semiconductor device. In a nitride semiconductor light emitting device, InGaN is often used for a quantum well layer included in its light emitting layer, and light emitting devices of a wide range of colors from blue to orange can be formed by adjusting the In content in InGaN. In recent years, blue and green light emitting diodes, violet semiconductor laser and others have been developed utilizing the characteristics of the nitride semiconductor light emitting devices.

In the case of forming a light emitting device using a quantum well layer of nitride semiconductor containing In, however, there are problems as follows. The nitride semiconductor containing In is very unstable in its chemical thermal equilibrium state. Thus, it is liable to experience phase separation (concentration separation) into regions of high In contents and regions of low In contents, which causes mottling in the light emitted from the light emitting device. In addition, the regions having the high In contents as a result of the concentration separation is liable to emit no light, leading to degradation of luminous efficiency.

On the other hand, Japanese Patent Laying-Open No. 10-270804 discloses a nitride semiconductor light emitting device having a light emitting layer including GaNAs (or GaNP or GaNSb) well layers and GaN barrier layers.

In this nitride semiconductor light emitting device, however, it is difficult to obtain steep composition change at the interface between the GaNAs well layer and the GaN barrier layer. Such insufficient steepness at the interface between the well and barrier layers causes increase of half-width of emission peak, increase of mottling, and degradation of luminous intensity (or gain reduction). Further, the fact that it is difficult to obtain steepness at the interface between the well and barrier layers means that it is difficult to form the multiple quantum well structure with these layers. Still further, the problems in the GaNAs well layer/GaN barrier layer may similarly arise also in GaNP well layer/GaN barrier layer and in GaNSb well layer/GaN barrier layer.

In view of the above-described problems of the prior art, an object of the present invention is, in a nitride semiconductor light emitting device including a quantum well layer of nitride semiconductor containing In, to suppress phase separation in the well layer to prevent mottling in light emitted from the device and improve luminous efficiency thereof.

Another object of the present invention is to improve steepness at an interface between well and barrier layers to provide a nitride semiconductor light emitting device of high luminous efficiency.

DISCLOSURE OF THE INVENTION

According to an aspect of the present invention, a nitride semiconductor light emitting device includes a light emitting layer having a quantum well structure in which quantum well layers and barrier layers are laminated alternately, and the quantum well layer is formed of nitride semiconductor containing In, and the barrier layer is formed of a nitride semiconductor layer containing As, P or Sb.

As such, the light emitting layer having a function of emitting light includes the quantum well layers and the barrier layers, and the quantum well layers each have an energy bandgap smaller than that of the barrier layers.

The nitride semiconductor light emitting device includes a substrate, and at least one of a first adjacent semiconductor layer in contact with a first main surface of the light emitting layer that is closer to the substrate and a second adjacent semiconductor layer in contact with a second main surface of the light emitting layer that is farther from the substrate, is preferably formed of nitride semiconductor containing Al. It is preferable that the first or second adjacent semiconductor layer is in direct contact with the quantum well layer.

Preferably, the light emitting layer includes at least two and at most ten well layers. It is preferable that the quantum well layer has a thickness of more than 0.4 nm and less than 20 nm, and the barrier layer has a thickness of more than 1 nm and less than 20 nm.

In the barrier layer, a dose of As atoms is preferably more than $1 \times 10^{18}/cm^3$, and the As atom content within the group V elements is preferably less than 20%. Further, in the barrier layer, a dose of P atoms is preferably more than $1 \times 10^{19}/cm^3$, and the P atom content within the group V elements is preferably less than 25%. Still further, in the barrier layer, a dose of Sb atoms is preferably more than $1 \times 10^{17}/cm^3$, and the Sb atom content within the group V elements is preferably less than 15%.

At least one of the well layer and the barrier layer preferably contains at least one dopant selected from a group consisting of Si, O, S, C, Ge, Zn, Cd and Mg. The dose of the dopant(s) is preferably in a range from $1 \times 10^{16}/cm^3$ to $1 \times 10^{20}/cm^3$.

GaN is preferably used for a substrate material of the nitride semiconductor light emitting device.

According to another aspect of the present invention, a nitride semiconductor light emitting device includes a light emitting layer having a quantum well structure in which quantum well layers and barrier layers are laminated alternately. The well layer is formed of $GaN_{1-x-y-z}As_xP_ySb_z$ ($0<x+y+z \leq 0.3$), and the barrier layer is formed of a nitride semiconductor layer containing In.

In the barrier layer, the In atom content within the group III elements is preferably more than 0.1% and less than 15%. At least one element selected from As, P and Sb is preferably included in the barrier layer. Further, in the barrier layer, a total sum of the atom contents of As, P and Sb within the group V elements is preferably more than $2 \times 10^{-5}\%$ and less than 20%.

The number of well layers in the light emitting layer is preferably at least 2 and at most 10. The light emitting layer is preferably formed on a nitride semiconductor substrate or a pseudo GaN substrate.

Here, the nitride semiconductor substrate refers to a substrate containing $Al_xGa_yIn_zN$ ($0 \leq x \leq 1$, $0 \leq y \leq 1$, $0 \leq z \leq$, x+y+z=1). In such a nitride semiconductor substrate, at most about 10% of the nitrogen atoms may be substituted with at least one kind of As, P and Sb atoms (provided that the hexagonal crystal system is maintained). Further, the nitride semiconductor substrate may contain at least one kind of impurity selected from a group consisting of Si, O, Cl, S, C, Ge, Zn, Cd, Mg and Be. Si, O and Cl are particularly preferable to make the nitride semiconductor substrate have an n type conductivity.

The pseudo GaN substrate refers to a substrate like a pseudo GaN substrate 1400 shown in FIG. 14 including a seed substrate 1401 for allowing crystal growth of at least a nitride semiconductor film and a growth inhibiting film 1404 for inhibiting the crystal growth of the nitride semiconductor film. It may also be a substrate like a pseudo GaN substrate 700*a* shown in FIG. 17B having a seed substrate or a nitride semiconductor film etched to include grooves which are then covered with another nitride semiconductor layer.

Preferably, the thickness of the well layer formed on the substrate is at least 3 nm and at most 20 nm, and the thickness of the barrier layer is also at least 3 nm and at most 20 nm. If the nitride semiconductor substrate or the pseudo GaN substrate is employed, however, the well layer may have a thickness of at least 0.4 nm and at most 20 nm, and the barrier layer may have a thickness of at least 1 nm and at most 20 nm.

At least one kind of impurity selected from a group consisting of Si, O, S, C, Ge, Zn, Cd and Mg may be added in the light emitting layer at a total dose in a range of more than $1 \times 10^{16}/cm^3$ and less than $1 \times 10^{20}/cm^3$.

The nitride semiconductor light emitting device as described above is suitably applicable to various kinds of optical devices including optical information reading devices, optical information writing devices, optical pickup devices, laser printer devices, projector devices, display devices, and white light source devices.

BRIEF DESCRIPTION OF THE DRAWINGS

Throughout the drawings, the same reference characters represent the same or corresponding portions.

BEST MODES FOR CARRYING OUT THE INVENTION

In general, GaN, sapphire and SiC are often used for substrate materials to grow a nitride semiconductor crystal layer. Similar to the GaN substrate, a substrate of other nitride semiconductor, e.g., $B_wAl_xGa_yIn_zN$ ($0 \leq w \leq 1$, $0 \leq x \leq 1$, $0 \leq y \leq 1$, $0 \leq z \leq$, w+x+y+z=1) may be used. In the case of a nitride semiconductor laser, an AlGaN substrate is preferably used, since it is necessary, for the purpose of realizing a unimodal vertical transverse mode, to provide a layer having a lower refractive index than that of a clad layer in direct contact with the outside of the clad layer. Further, N in the $B_wAl_xGa_yIn_zN$ substrate may be substituted in a range of at most about 10% with any of As, P and Sb. In addition, the substrate may be doped with Si, O, Cl, S, C, Ge, Zn, Cd, Mg or Be. Of these doping agents, Si, O and Cl are particularly preferable for an n type nitride semiconductor substrate.

Of the substrates as described above, a sapphire substrate and a C plane {0001} substrate of nitride semiconductor will be primarily explained in the following embodiments. However, the main surface of the substrate may have a plane orientation of A plane {11-20}, R plane {1-102} or M plane {1-100}, besides the C plane. A substrate having an off-angle within two degrees from any of these plane orientations can have a semiconductor crystal layer grown thereon with favorable surface morphology.

For growing a nitride semiconductor crystal layer, metallorganic chemical vapor deposition (MOCVD), molecular beam epitaxy (MBE), hydride vapor phase epitaxy (HVPE) and others are employed in general. When crystallinity and productivity of a nitride semiconductor layer to be formed are taken into account, it is most common that GaN or sapphire is used for the substrate and MOCVD is used as the crystal growing method.

First Embodiment

Figure 1:
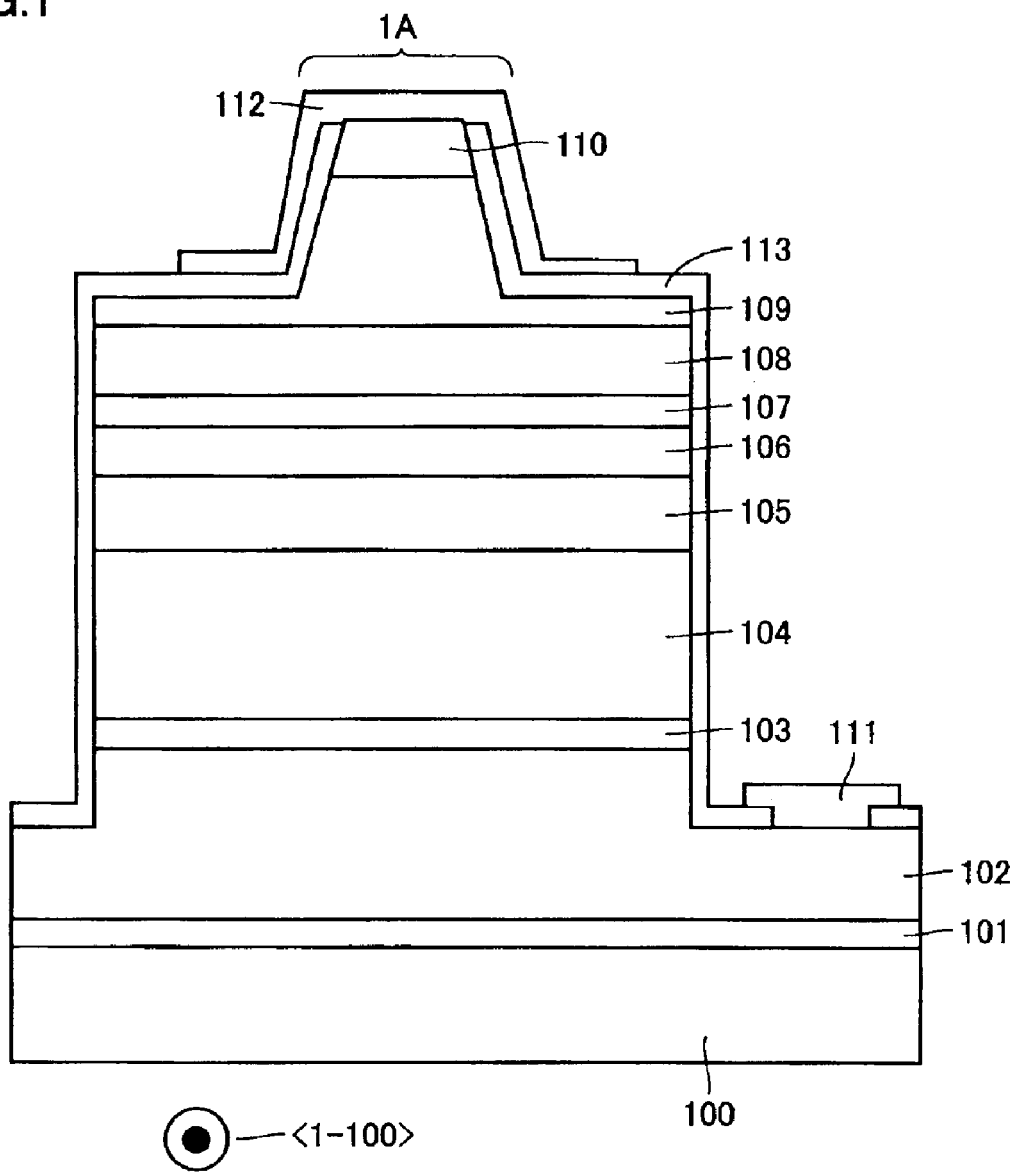
FIG. 1 is a schematic cross sectional view showing a structure of a nitride semiconductor laser device according to an embodiment of the present invention.

A nitride semiconductor laser diode device according to a first embodiment shown in FIG. 1 in schematic cross section includes: a C plane (0001) sapphire substrate 100; a GaN buffer layer 101; an n type GaN contact layer 102; an n type $In_{0.07}Ga_{0.93}N$ anti-crack layer 103; an n type $Al_{0.1}Ga_{0.9}N$ clad layer 104; an n type GaN light guide layer 105; a light emitting layer 106; a p type $Al_{0.2}Ga_{0.8}N$ shield layer 107; a p type GaN light guide layer 108; a p type $Al_{0.1}Ga_{0.9}$ clad layer 109; a p type GaN contact layer 110; an n type electrode 111; a p type electrode 112; and a $SiO_2$ dielectric film 113. That is, in the present embodiment, the laser structure is formed on the sapphire substrate, in the order of the buffer layer, the n type layers for supplying electrons of negative charges, the light emitting layer, and the p type layers for supplying holes of positive charges.

In forming the laser diode device in FIG. 1, sapphire substrate 100 is first set in a MOCVD system, and $NH_3$ (ammonia) as a source material for group V element N and TMGa (trimethylgallium) as a source material for group III element Ga are used to grow GaN buffer layer 101 to a thickness of 25 nm at a relatively low substrate temperature of 550° C. Next, $SiH_4$ (silane) is added to $NH_3$ and TMGa to grow GaN contact layer 102 (Si impurity concentration: $1 \times 10^{18}/cm^3$) to a thickness of 3 µm at 1050° C. Thereafter, the substrate temperature is lowered to about 700–800° C., and TMIn (trimethylindium) as a source material for group III element In is used to grow n type $In_{0.07}Ga_{0.93}N$ anti-crack layer 103 to a thickness of 40 nm. The substrate temperature is raised again to 1050° C., and TMAl (trimethylaluminum) as a source material for group III element Al is used to grow n type $Al_{0.1}Ga_{0.9}N$ clad layer 104 (Si impurity concentration: $1 \times 10^{18}/cm^3$) to a thickness of 0.8 µm. GaN light guide layer 105 (Si impurity concentration: $1 \times 10^{18}/cm^3$) is then grown to a thickness of 0.1 µm.

Thereafter, with the substrate temperature being lowered to 800° C., light emitting layer 106 is formed having a multiple quantum well structure in which a plurality of 8 nm thick $GaN_{0.99}P_{0.01}$ barrier layers and a plurality of 4 nm thick $In_{0.18}Ga_{0.82}N$ well layers are laminated alternately. In the present embodiment, light emitting layer 106 has the multiple quantum well structure starting with one of the barrier layers and ending with another of the barrier layers, including three quantum well layers (three cycles). $SiH_4$ is added during growth of these barrier and well layers so that both the layers have the Si impurity concentration of $1 \times 10^{18}/cm^3$. A growth break interval of at least one second and at most 180 seconds may be provided between growth of the barrier layer and growth of the well layer, or between growth of the well layer and growth of the barrier layer. This can improve flatness of the barrier and well layers and also decrease the half-width of the emission peak.

After formation of light emitting layer 106, the substrate temperature is raised again to 1050° C. to successively grow 20 nm thick p type $Al_{0.2}Ga_{0.8}N$ shield layer 107, 0.1 µm thick p type GaN light guide layer 108, 0.5 µm thick p type $Al_{0.1}Ga_{0.9}$ clad layer 109, and 0.1 µm thick p type GaN contact layer 110. As the p-type impurity, Mg may be added at a concentration from $5 \times 10^{19}/cm^3$ to $2 \times 10^{20}/cm^3$ using $EtCP_2Mg$ (bisethylcyclopentadienyl magnesium).

The p type impurity concentration in p type GaN contact layer 110 is preferably increased as it approaches the junction surface with p type electrode 112. This can reduce the contact resistance with the p type electrode. Further, oxygen may be added by a minute amount during growth of the p type layers, to remove residual hydrogen that hinders activation of Mg as the p type impurity in the p type layers.

After the growth of p type GaN contact layer 110, the entire gas within the reaction chamber of the MOCVD system is replaced with nitrogen carrier gas and $NH_3$, and the temperature is decreased at a rate of 60° C./min. Supply of $NH_3$ is stopped when the substrate temperature is decreased to 800° C. The substrate temperature is maintained at 800° C. for five minutes, and then lowered to the room temperature. As such, the substrate is temporarily held at a temperature preferably in a range from 650° C. to 900° C., for a time period preferably in a range from 3 minutes to 10 minutes. The cooling rate from the holding temperature to the room temperature is preferably more than 30° C./min.

The surface of the film thus grown was evaluated by Raman spectroscopy, and it was found that the film already had p type characteristics immediately after its growth, even though a conventional annealing for making nitride semiconductor films have such p type characteristics was not carried out. Upon formation of p type electrode 112, the contact resistance was also already reduced. If the conventional annealing for giving p type characteristics is additionally applied, the activation ratio of Mg will further be improved.

Processes of making laser diode devices from the epitaxial wafer taken out of the MOCVD system are now explained.

Firstly, reactive ion etching equipment is used to expose a portion of n type GaN contact layer 102, to form n type electrode 111 consisting of laminated layers of Hf and Au in this order on the exposed portion. Laminated layers of Ti/Al, Ti/Mo, Hf/Al or the like may also be employed for this n type electrode 111. Hf is effective in lowering the contact resistance of the n type electrode. In a portion for the p type electrode, etching is carried out in a stripe manner along a <1-100> direction of sapphire substrate 100, and $SiO_2$ dielectric film 113 is formed by evaporation. Then, p type GaN contact layer 110 is exposed, and Pd and Au are vapor-deposited in this order. Thus, p type electrode 112 of a width of 2 μm is formed in a ridge stripe manner. This p type electrode may also be formed of laminated layers of Ni/Au, Pd/Mo/Au or the like.

Figure 2:
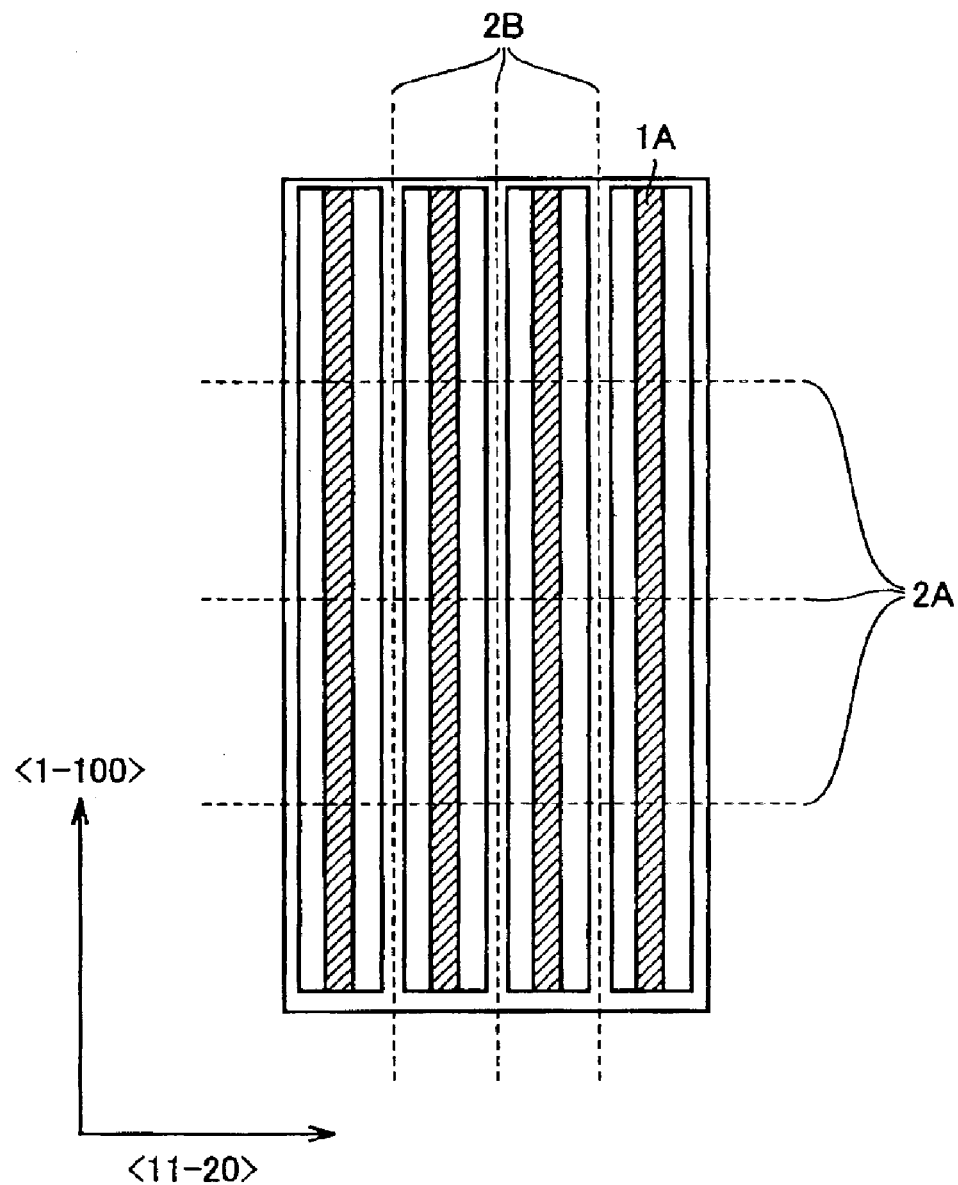
FIG. 2 is a schematic top plan view illustrating chip division into laser devices according to another embodiment.

Lastly, cleavage or dry etching is utilized to form Fabry-Perot resonators of 500 μm each in length. In general, the resonator length is preferably in a range from 300 μm to 1000 μm. The resonator is formed to have a pair of mirror end surfaces parallel to the M plane of the sapphire substrate (see FIG. 2). The cleavage and chip division into laser devices are carried out using a scriber on the substrate side, along the broken lines 2A and 2B in FIG. 2. This ensures flatness of the laser end surfaces, and also prevents shavings after scribing from attaching to the surfaces of the epitaxial layers, thereby increasing the yield of the light emitting devices.

The feedback method of the laser resonator is not limited to the Fabry-Perot type as described above, but of course it is possible to use DFB (Distributed Feedback), DBR (Distributed Bragg Reflector), or any other type known generally.

After formation of the mirror end surfaces of the Fabry-Perot resonator, dielectric films of $SiO_2$ and $TiO_2$ are alternately formed on one of the mirror end surfaces by evaporation, to form a dielectric multilayer reflection film having a reflectance of 70%. A multilayer film of $SiO_2$/$Al_2O_3$ or the like may also be employed as the dielectric multilayer reflection film.

The reason why the portion of n type GaN contact layer 102 is exposed by reactive ion etching is that insulative sapphire substrate 100 is used. If a conductive substrate such as a GaN substrate or a SiC substrate is used, the n type electrode may be formed on the back side of the conductive substrate, without need to partially expose n type GaN layer 102. In the embodiment described above, a plurality of n type layers, a light emitting layer and a plurality of p type layers are crystal-grown in this order on the substrate. Alternatively, they may be crystal-grown in the order of the p type layers, the light emitting layer and the n type layers.

The way of packaging the laser diode chip as described above is now explained. Firstly, in the case that a laser diode including the light emitting layer as described above is employed taking advantage of its characteristics for a high output (50 mW) violet color (wavelength: 410 nm) laser that is suitable for a high-density recording optical disk, attention should be given to heat radiation because of low heat conductivity of the sapphire substrate. For example, it is preferable to use an In soldering material to connect the chip to a package body, with the semiconductor junction facing down. Incidentally, the chip may be connected via a sub-mount having good heat conductivity, such as Si, AlN, diamond, Mo, CuW, BN, Cu, Au or Fe, instead of being directly attached to the package body or a heat sink portion.

Figure 14:
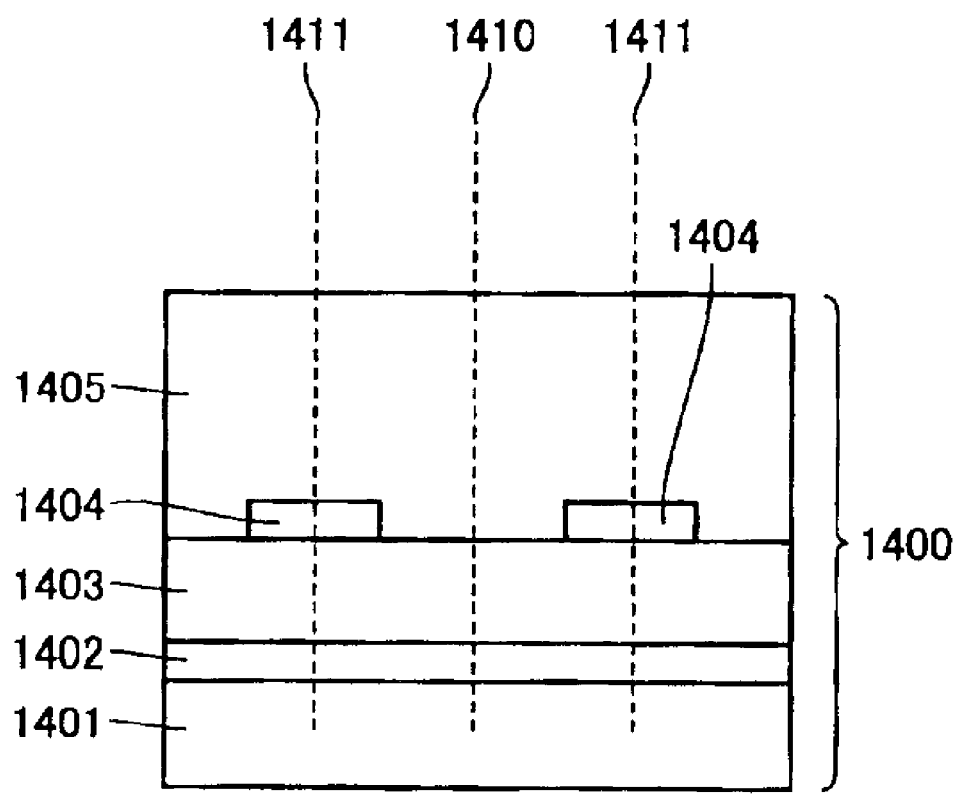
FIG. 14 is a schematic cross sectional view of a nitride semiconductor thick film substrate that can be used in the light emitting device according to the present invention.

On the other hand, in the case that a nitride semiconductor laser diode including the light emitting layer as described above is formed on a substrate having high heat conductivity, such as SiC substrate, nitride semiconductor substrate (e.g., GaN substrate) or GaN thick film substrate (e.g., substrate 1400 as shown in FIG. 14 from which seed substrate 1401 is removed by polishing), the chip may also be connected to the package body using, e.g., an In soldering material, with the semiconductor junction facing up. In this case, again, instead of directly attaching the chip substrate to the package body or the heat sink portion, a sub-mount such as of Si, AlN, diamond, Mo, CuW, BN, Cu, Au or Fe may be interposed therebetween.

In such a manner as described above, it is possible to prepare a laser diode utilizing a nitride semiconductor containing As, P or Sb for barrier layers within its light emitting layer.

The light emitting layer 106 included in the laser diode of the above embodiment is now explained in more detail.

In the case of forming a light emitting device including a well layer of nitride semiconductor containing In (e.g., InGaN), the nitride semiconductor containing In is very unstable in its chemical thermal equilibrium state as described above and thus it is liable to undergo phase separation (concentration separation) into regions having high In concentration and regions having low In concentration, causing color mottling in light emitted form the light emitting device. Further, the regions with high In concentration thus created is liable to emit no light, leading to degradation of luminous efficiency. As such, it has been desired to improve crystallinity of the nitride semiconductor well layer containing In to increase the yield of the light emitting devices.

In this regard, the inventors have found, through detailed analysis of the well layer containing In, that the concentration separation of the nitride semiconductor well layer containing In is attributable to coagulation (segregation) of In atoms caused by escape of N from the well layer. Thus, in the present embodiment, it is intended to solve the problem by providing a nitride semiconductor barrier layer containing As, P or Sb in contact with the nitride semiconductor well layer containing In. Such inclusion of As, P or Sb being the same group V element as N and having a larger atomic radius than N in the barrier layer can prevent escape of the N atoms from the well layer. It is thus possible to suppress In segregation in the well layer and thereby prevent concentration separation.

In a crystal of GaNAs, GaNP, GaNSb, InGaNAs, InGaNP or InGaNSb having some of N atoms in the nitride semiconductor of GaN or InGaN substituted with As, P or Sb atoms, if the content of the substituted atoms increases, phase separation (crystal system separation) is caused into the hexagonal system having a high N content and the cubic system (zincblende structure) having a low N content. The cubic system having such a low N content causes grain boundaries and also causes a considerable number of crystal defects and boundary gaps due to the crystal system different from the hexagonal system having the high N content. When the ratio of the grain boundaries increases in the barrier layer, N is liable to easily escape from the well layer through the crystal defects and the boundary gaps. This results in significant In segregation in the well layer, making it impossible to suppress the concentration separation. That is, if the ratio of the N atoms in the group V elements is less than 50%, the zincblende structure of the cubic system becomes dominant, thereby causing the problems due to the different crystal systems. Thus, the nitride semiconductor barrier layer of the present embodiment needs to contain N atoms of greater than 50% in the group V elements.

In the present embodiment, a well layer of InGaN, InAlGaN or the like may be used as the nitride semiconductor well layer containing In, as described above. In such a well layer, the content(s) of In and/or Al can be optimized to obtain light of an intended wavelength. A barrier layer of GaNAs, InGaNAs, AlGaNAs, InAlGaNAs or the like may be used as the nitride semiconductor barrier layer containing As, P or Sb in the present embodiment. In such a barrier layer, P and/or Sb may be contained instead of at least a portion of As. Further, the energy bandgap of the barrier layer is set greater than that of the well layer in the light emitting layer of the present embodiment.

The barrier layer preferably has a thickness of at least 1 nm and at most 20 nm. If it is thinner than 1 nm, it would be difficult to prevent escape of N from the well layer. If it is thicker than 20 nm, the crystallinity would start to degrade undesirably. The well layer in contact with the barrier layer preferably has a thickness of at least 0.4 nm and at most 20 nm. If it is less than 0.4 nm, the light emitting action of the well layer would not be expected. If the well layer is thicker than 20 nm, the crystallinity would start to degrade. It is preferable that the barrier layer has a thickness equal to or less than that of the well layer to form energy sub-bands with the multiple quantum well structure, but it is preferable on the other hand that the thickness of the barrier layer is equal to or greater than that of the well layer to prevent concentration separation of the well layer.

Figure 3:
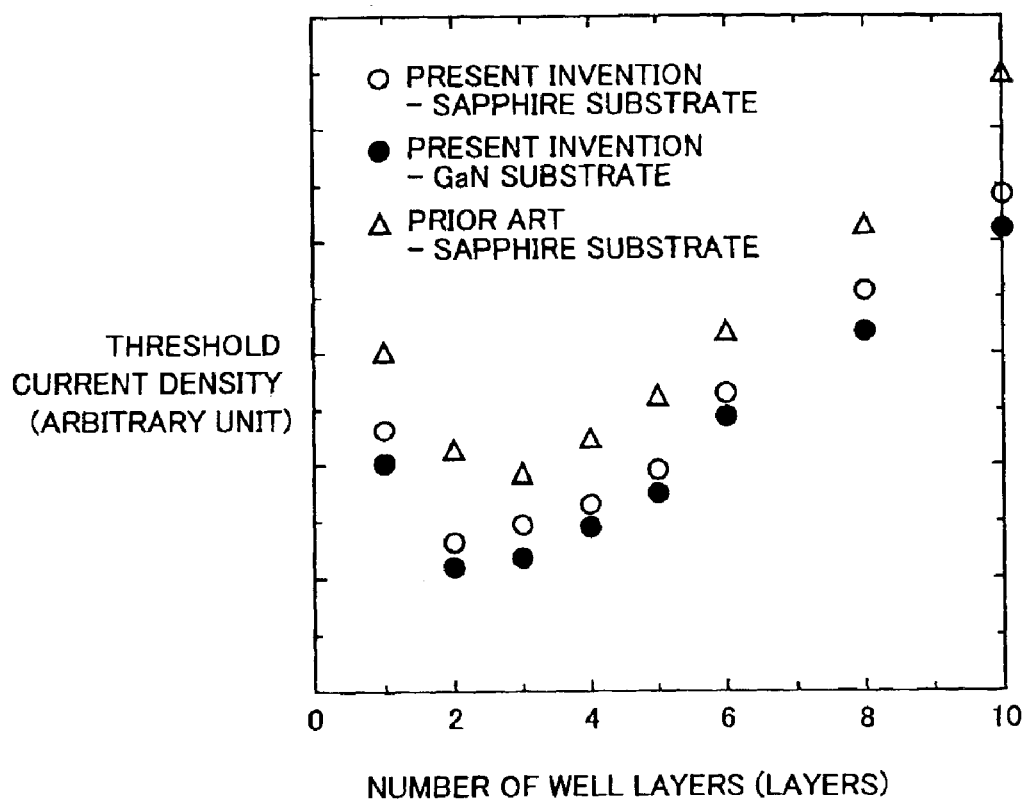
FIG. 3 is a graph showing the relation between the number of well layers and the threshold current density in the laser devices.

FIG. 3 shows the relation between the number of well layers included in the light emitting layer (multiple quantum well structure) and the laser threshold current density. In this graph, ○ mark and ● mark represent the laser threshold current density in the laser diode of the present embodiment formed on a sapphire substrate and on a GaN substrate, respectively. Δ mark represents the threshold current density in the conventional laser diode formed on a sapphire substrate. As seen from FIG. 3, the lasing threshold current density is reduced in the both laser diodes of the present embodiment formed on the sapphire and GaN substrates, compared to that of the conventional laser diode. This is because the In concentration separation in the well layer is suppressed in the present embodiment, irrespective of the sapphire substrate or the GaN substrate being used. In the laser diodes according to the present embodiment, the lasing threshold current density is further reduced with the GaN substrate than with the sapphire substrate. This presumably is because homoepitaxial growth of the semiconductor layer proceeds on the GaN substrate, so that dislocation density and lattice strain within the grown semiconductor layer become less than in the case of employing the sapphire substrate. Regarding the number of well layers included in the light emitting layer of the present embodiment, the threshold current density decreased and the lasing continued at room temperature when the number of the well layers was 10 or less. As seen from FIG. 3, it is desirable to provide the well layers of at least 2 and at most 5 to further reduce the lasing threshold current density.

As to the impurity added in the light emitting layer, $SiH_4$ (Si) has been added as the impurity in both the well layer and the barrier layer in the laser diode of the present embodiment. Although lasing is possible even if it is added in either one or none of the layers, the lasing threshold current density is lowered when it is added to the both layers. According to photoluminescence (PL) measurement, PL luminous intensity increased to about 1.2–1.4 times when Si was added in both of the well and barrier layers compared to that in the case that it was added to none of them. As such, it is preferable to add the impurity like Si in the light emitting layer, presumably because the added impurity forms a nucleus for crystal growth, around which a crystal grows, and thus crystallinity of the light emitting layer improves. In the present embodiment, Si has been added in a concentration of $1×10^{18}/cm^3$. The similar effects can be obtained even when O, S, C, Ge, Zn, Cd or Mg is added instead of Si. The concentration of the added atoms is preferably in a range from about $1×10^{16}/cm^3$ to about $1×10^{20}/cm^3$. Particularly in the case that crystal growth starts with the sapphire substrate different from the nitride semiconductor substrate, since a large amount of crystal defects (penetrating dislocation density: about $1×10^{10}/cm^2$) are liable to be generated, it is preferable to add impurity in the light emitting layer to improve crystallinity.

On the light emitting layer 106, p type AlGaN shield layer 107 and p type layer 108 are laminated in this order. This p type layer 108 corresponds to a p type light guide layer in the case of a laser diode, and corresponds to a p type clad layer or a p type contact layer in the case of a light emitting diode.

According to the PL measurement, PL luminous intensity was greater in the presence of shield layer 107 than in the absence of shield layer 107, with a less shifted amount from a designed wavelength of emitted light. In particular, the effect of shield layer 107 was significant when the light emitting layer 106 of a multiple quantum well structure had the structure as shown in FIG. 4B starting and ending both with the well layers. Further, the effect of the shield layer was more significant with the well layer of InGaN than with the well layer of InAlGaN. Although the reason is not clear, this may be because the protecting effect of the shield layer containing Al is observed more significantly when the well layers at the both ends of the light emitting layer are formed of InGaN not containing Al. In other words, since Al is highly reactive and has strong bonding force, it is considered that provision of the shield layer containing Al suppresses escape of N from the well layer during growth of the p type layer requiring higher deposition temperature than growth of the light emitting layer.

From the foregoing, it is important that shield layer 107 contains at least Al. Further, the shield layer preferably has p type polarity; otherwise, the position of pn junction near the light emitting layer would change, causing degradation of luminous efficiency.

Similarly to the above-described case, an n type AlGaN shield layer may be provided between light emitting layer 106 and n type layer 105 in contact with the both layers. This n type layer 105 corresponds to an n type light guide layer in the case of a laser diode, and corresponds to an n type clad layer or an n type contact layer in the case of a light emitting diode. Such an n type AlGaN shield layer has the similar effects as p type AlGaN shield layer 107.

Figure 4A:
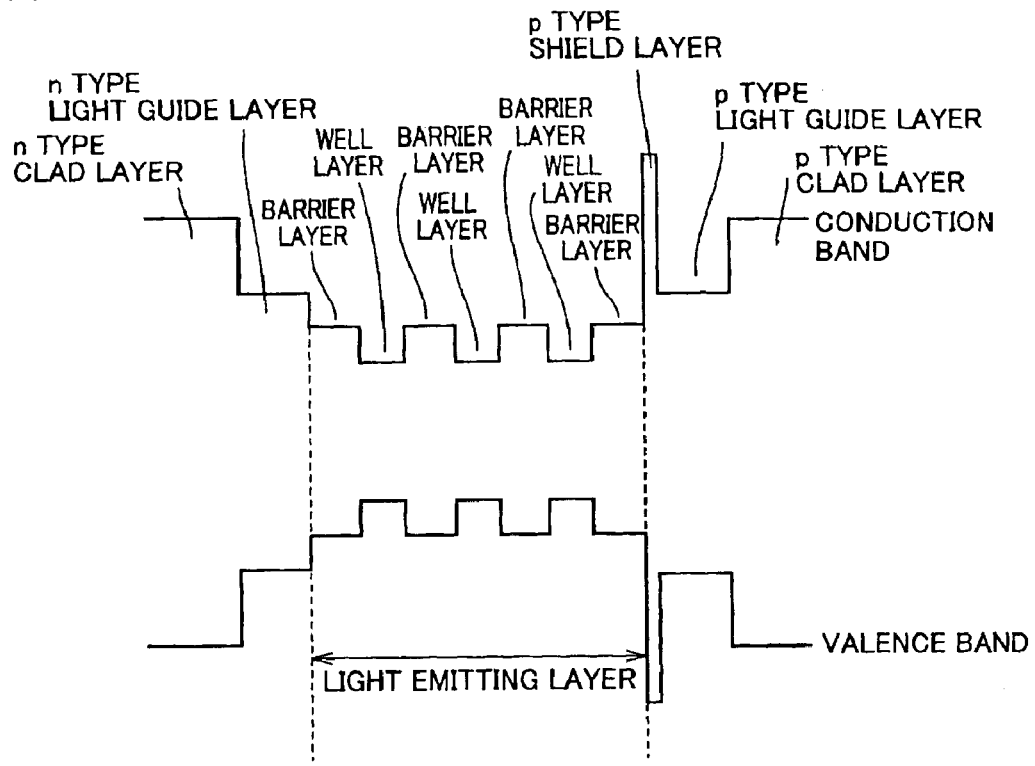
FIGS. 4A and 4B schematically show energy bandgap structures in the light emitting devices of other embodiments.
Figure 4B:
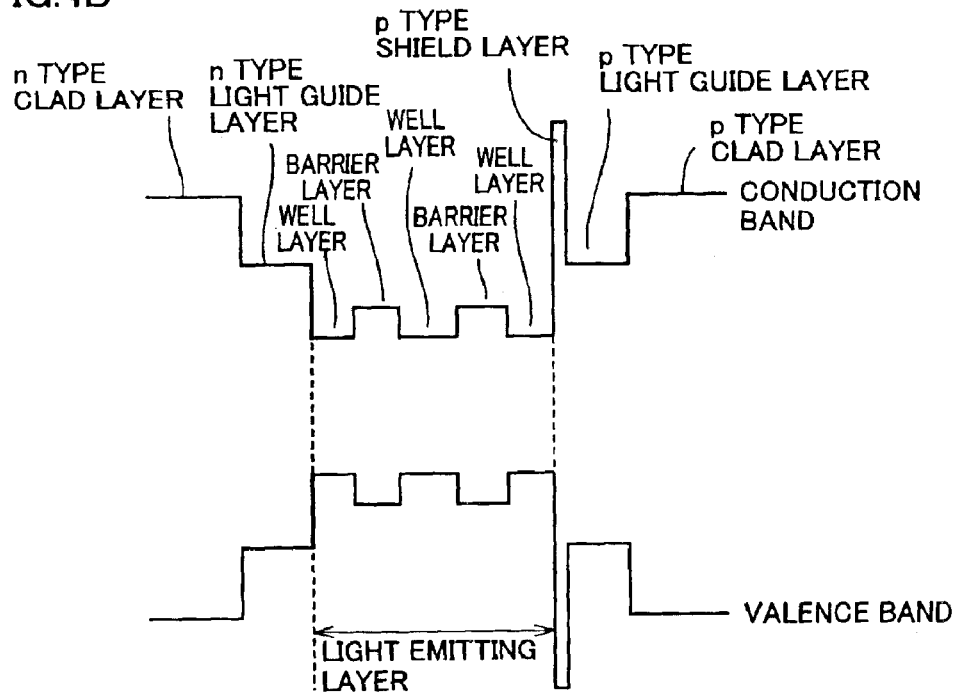
Figure 6:
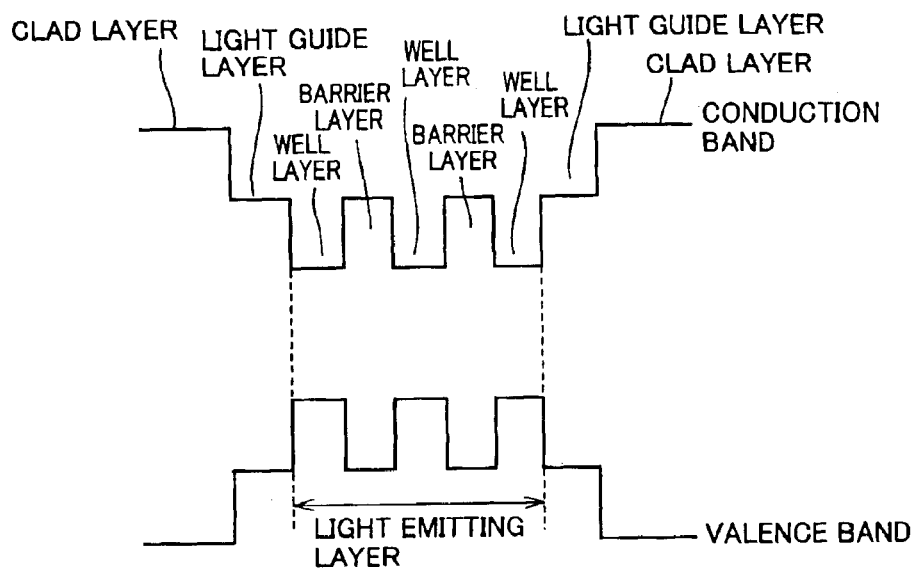
FIG. 6 schematically shows yet another example of the energy bandgap structure in a light emitting device of yet another embodiment.

Examples of the bandgap structure of the light emitting layer and the light guide layer are shown in FIGS. 6 and 4A. In the present embodiment, the light guide layer and the barrier layer may be different in energy bandgap as shown in FIG. 4A, or may have the same energy bandgaps as shown in FIG. 6.

However, the energy bandgap made smaller in the barrier layer than in the light guide layer as shown in FIG. 4A makes it easier to obtain the multiple quantum well effect by virtue of the sub-bands, compared to the one shown in FIG. 6. Then, the refractive index of the barrier layer also becomes greater than that of the light guide layer, so that the light confining effect improves, leading to favorable (unimodal) characteristics of the vertical transverse mode. In particular, the barrier layer containing As, P or Sb is advantageous in that its refractive index increases significantly.

Figure 5A:
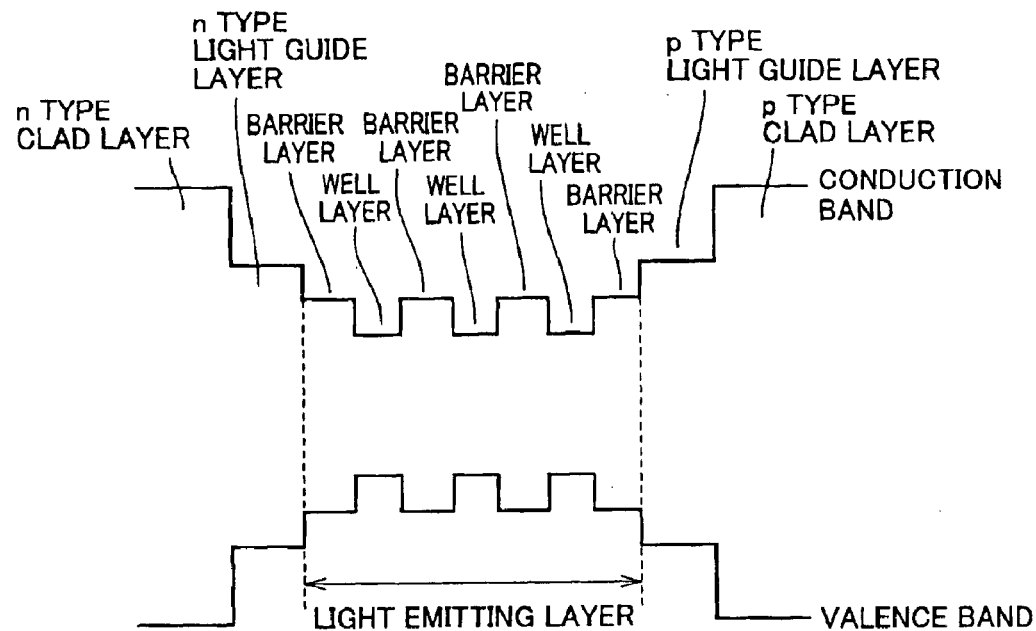
FIGS. 5A and 5B schematically show other examples of the energy bandgap structures in the light emitting devices of other embodiments.
Figure 5B:
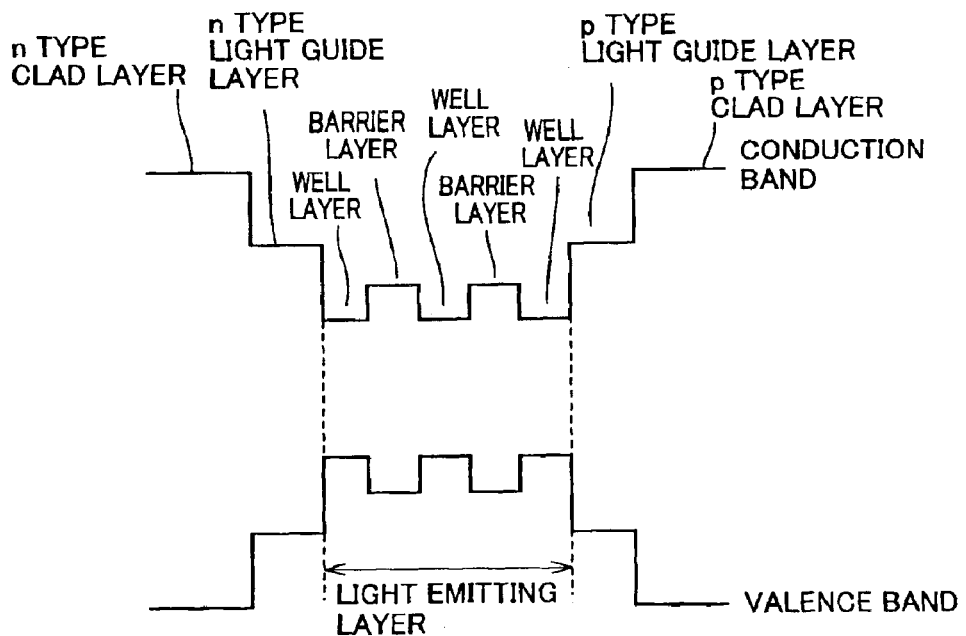

As described above, the light emitting layer having the energy bandgaps made smaller in the barrier layers than in the light guide layers can be configured in two ways, as shown in FIGS. 4A and 4B. That is, the light emitting layer having the multiple quantum well structure may start and end with the barrier layers or start and end with the well layers. Examples of the bandgap structure of the light emitting layer unprovided with a shield layer are shown in FIGS. 5A and 5B.

Second Embodiment

In the second embodiment, various kinds of nitride semiconductor materials are employed for the well layer and the barrier layer in the light emitting layer having the multiple quantum well structure described in the first embodiment. Table 1 shows combinations of the nitride semiconductor materials of the well and barrier layers.

TABLE 1

| Barrier Layer | Well Layer | |
|---|---|---|
| | InGaN | InAlGaN |
| GaNAs | ⊙ | ○ |
| GaNP | ⊙ | ○ |
| GaNSb | ⊙ | ○ |
| InGaNAs | ⊙ | ○ |
| InGaNP | ⊙ | ○ |
| InGaNSb | ⊙ | ○ |
| AlGaNAs | ⊙ | ○ |
| AlGaNP | ⊙ | ○ |
| AlGaNSb | ⊙ | ○ |
| InAlGaNAs | ○ | ○ |
| InAlGaNP | ○ | ○ |
| InAlGaNSb | ○ | ○ |

In Table 1, ○ mark indicates a preferable combination of nitride semiconductor materials of the well and barrier layers, and ⊙ mark indicates a particularly preferable combination thereof. That is, in the present embodiment, well layers of InGaN and InAlGaN may be preferably employed as the nitride semiconductor well layers. Light of an intended wavelength can be obtained by optimizing the In and/or Al content in the well layers. When the well layer contains Al, escape of N can be suppressed, since crystallinity is stabilized even at a high growth temperature by virtue of high reactivity and strong bonding force of Al. With the well layer containing Al, however, its energy bandgap increases in proportion to the added amount of Al. Thus, attention must be paid to maintenance of the relation that the bandgap in the barrier layer is greater than that in the well layer. The InGaN well layer having a broader condition range satisfying this energy relation is more preferable than the InAlGaN well layer. For the nitride semiconductor barrier layer, GaNAs, InGaNAs, AlGaNAs, InAlGaNAs and others may be employed. In these barrier layers, at least a portion of As may be substituted with P and/or Sb. Barrier layers of the ternary system such as GaNAs and the quaternary system such as InGaNAs and AlGaNAs are more preferable in that they are superior in reproducibility to barrier layers of the quinary system such as InAlGaNAs and others.

Third Embodiment

In the third embodiment, the As, P or Sb content in the barrier layer within the light emitting layer as described in the first embodiment is varied.

Figure 7:
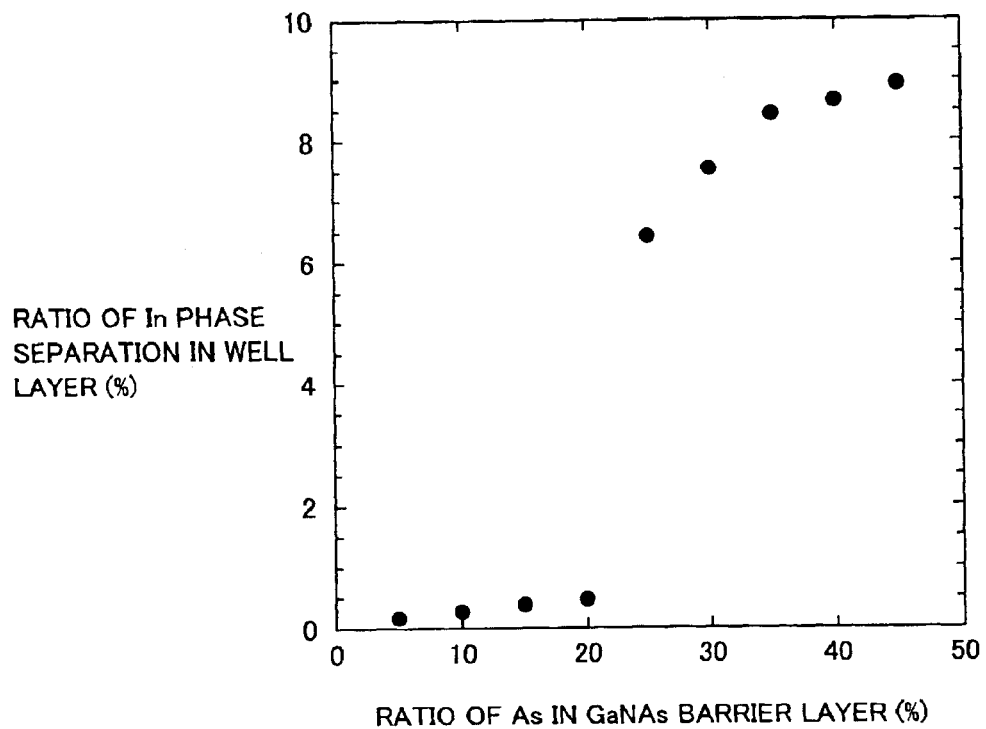
FIG. 7 is a graph illustrating the relation between the ratio of As atoms in the group V elements within the GaNAs barrier layer and the ratio of phase separation of In in the well layers in the laser devices of other embodiments.

FIG. 7 shows the relation between the ratio of As in the group V elements within the GaNAs barrier layer and the ratio of In phase separation (concentration separation) in the well layer. Here, the ratio of the In concentration separation in the well layer means the volume percentage of high In concentration regions generated by the In concentration separation in the entire well layer. As shown in FIG. 7, when the ratio (content) of As in the group V elements within the barrier layer exceeds 20%, the ratio of In concentration separation in the well layer suddenly increases, presumably because of the following reasons. When the As content increases, the GaNAs crystal suffers crystal system separation into the hexagonal system having a high N content and the cubic system having a low N content (zincblende structure). The cubic system having such a low N content causes grain boundaries and also causes a large number of crystal defects and boundary gaps due to the crystal system different from the hexagonal system having the high N content. When the ratio of the grain boundaries increases in the barrier layer, N is liable to easily escape from the well layer. This results in significant In segregation in the well layer, inevitably causing the concentration separation effect. Thus, in order to suppress the In concentration separation in the well layer, the As content in the barrier layer needs to be less than 20%. The ratio of the In concentration separation in the well layer is preferably less than 5%, and more preferably less than 2%.

Figure 8:
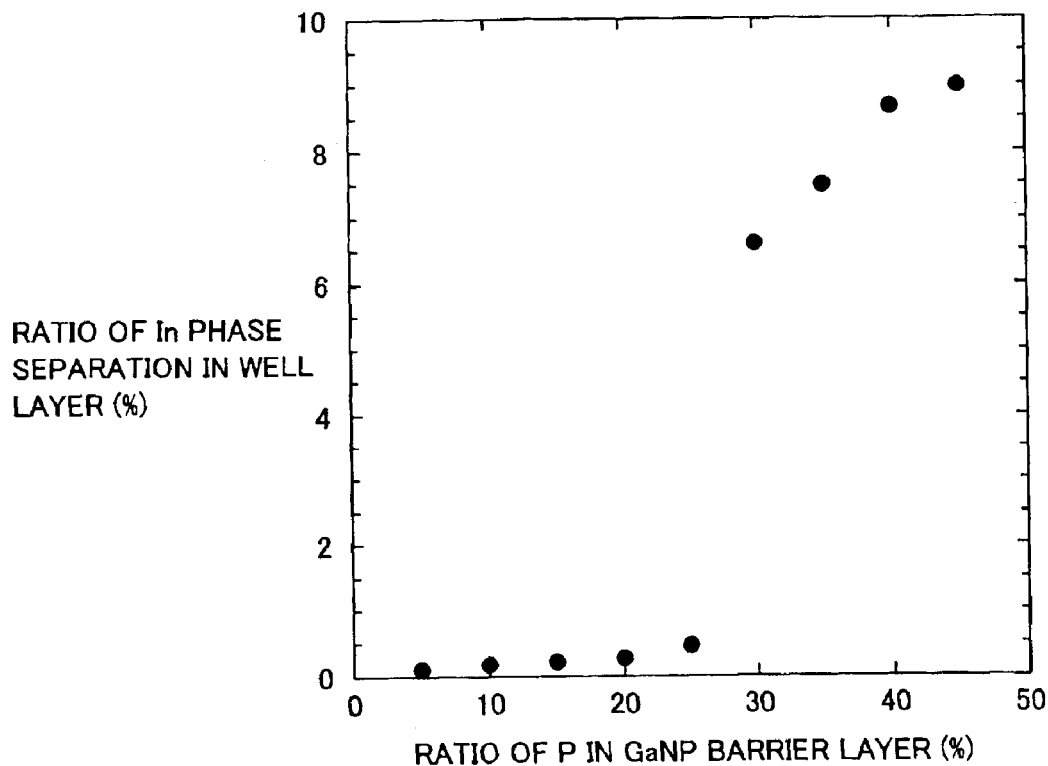
FIG. 8 is a graph illustrating the relation between the ratio of P atoms in the group V elements within the GaNP barrier layer and the ratio of In phase separation in the well layer in the laser devices of other embodiments.
Figure 9:
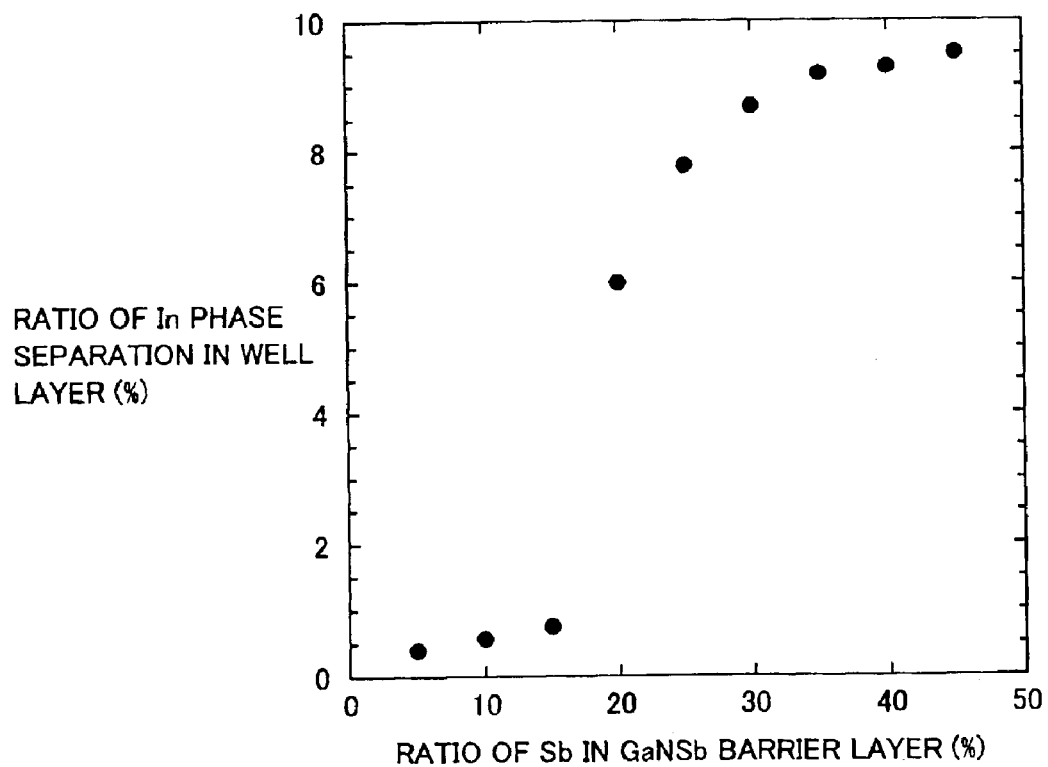
FIG. 9 is a graph illustrating the relation between the ratio of Sb atoms in the group V elements within the GaNSb barrier layer and the ratio of In phase separation in the well layer in the laser devices of other embodiments.

As shown in FIGS. 8 and 9, the similar results were obtained even in the case that P or Sb was added instead of As. As seen from FIGS. 8 and 9, the P content in the barrier layer is preferably less than 25%, and the Sb content is preferably less than 15%. With the barrier layer containing P or Sb, the ratio of In concentration separation in the well layer is preferably less than 5%, and more preferably less than 2%, similarly as in the case of the barrier layer containing As.

Figure 10:
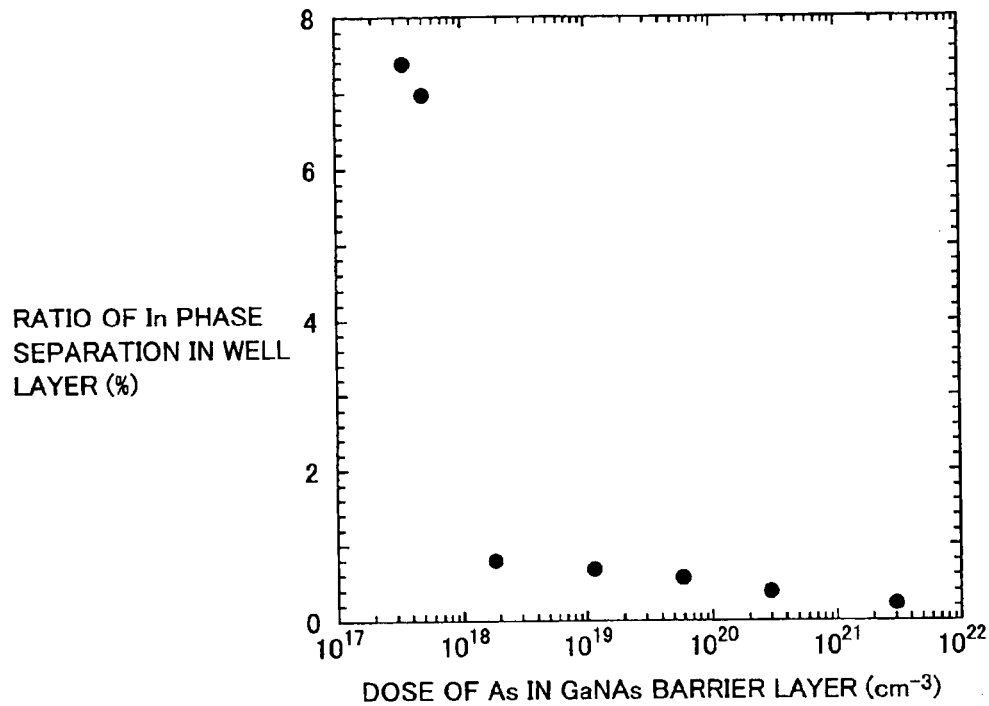
FIG. 10 is a graph illustrating the relation between the dose of As in the group V elements within the GaNAs barrier layer and the ratio of In phase separation in the well layer in the laser devices of other embodiments.
Figure 11:
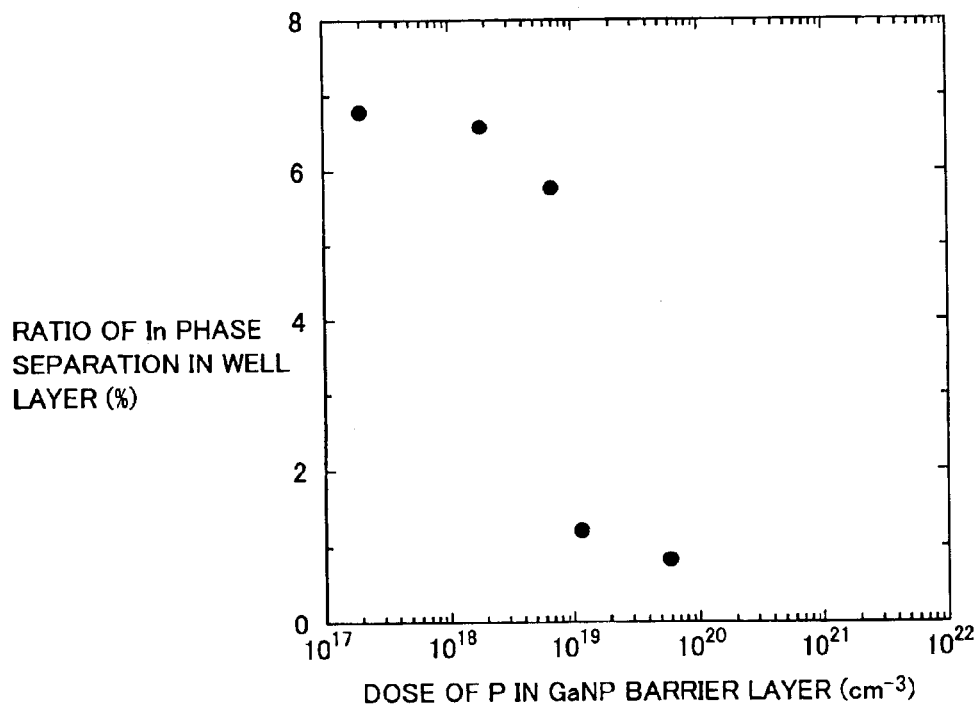
FIG. 11 is a graph illustrating the relation between the dose of P in the group V elements within the GaNP barrier layer and the ratio of In phase separation in the well layer in the laser devices of other embodiments.
Figure 12:
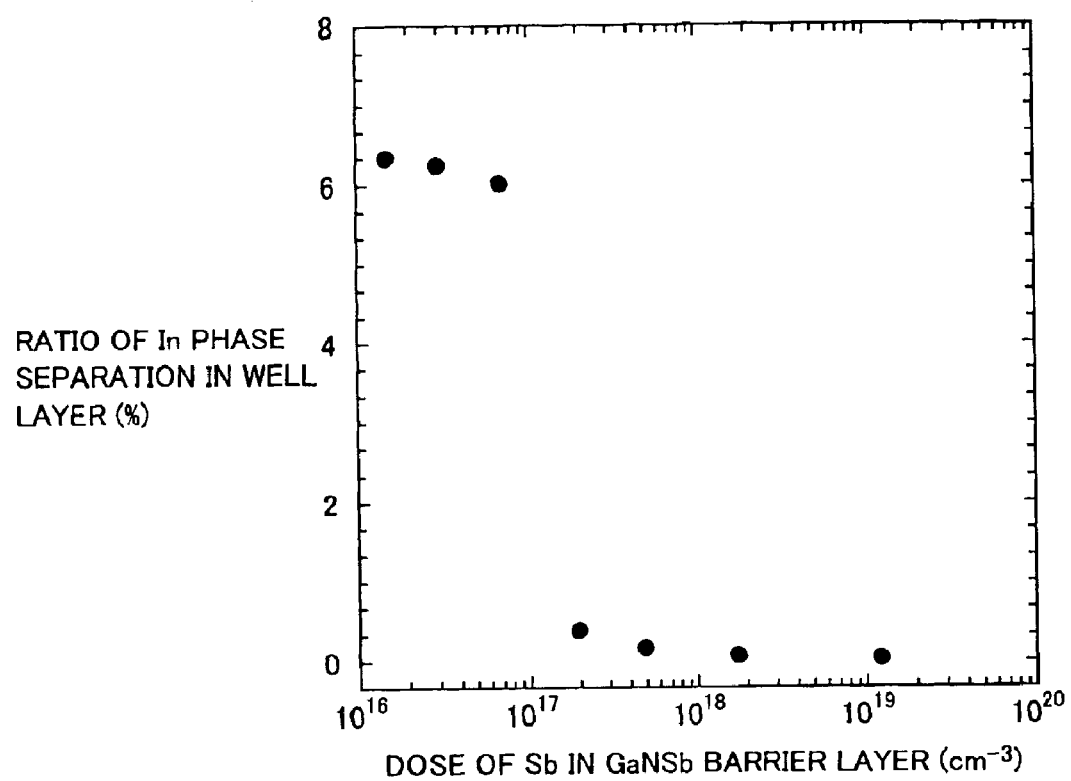
FIG. 12 is a graph illustrating the relation between the dose of Sb in the group V elements within the GaNSb barrier layer and the ratio of In phase separation in the well layer in the laser devices of other embodiments.

FIG. 10 shows the relation between the added (doped) amount of As in the GaNAs barrier layer and the ratio of In phase separation (concentration separation) in the well layer. As seen from FIG. 10, the effect of preventing escape of N from the well layer by virtue of As having a larger atomic radius than N, is not obtained when the doped amount of As in the barrier layer is less than $1\times10^{18}/cm^3$, in which case In segregation occurs in the well layer, making it impossible to suppress occurrence of concentration separation. Thus, to realize the size effect of As in the barrier layer, the doped amount thereof needs to be more than $1\times10^{18}/Cm^3$. As shown in FIGS. 11 and 12, the same applies to the case that P or Sb instead of As is added in the barrier layer. In this case, P of more than $5\times10^{19}/cm^3$, or Sb of more than $1\times10^{17}/cm^3$, needs to be added in the barrier layer. Whether As, P or Sb is added in the barrier layer, the ratio of In concentration separation in the well layer is preferably less than 5%, and more preferably less than 2%.

Fourth Embodiment

Figure 13:
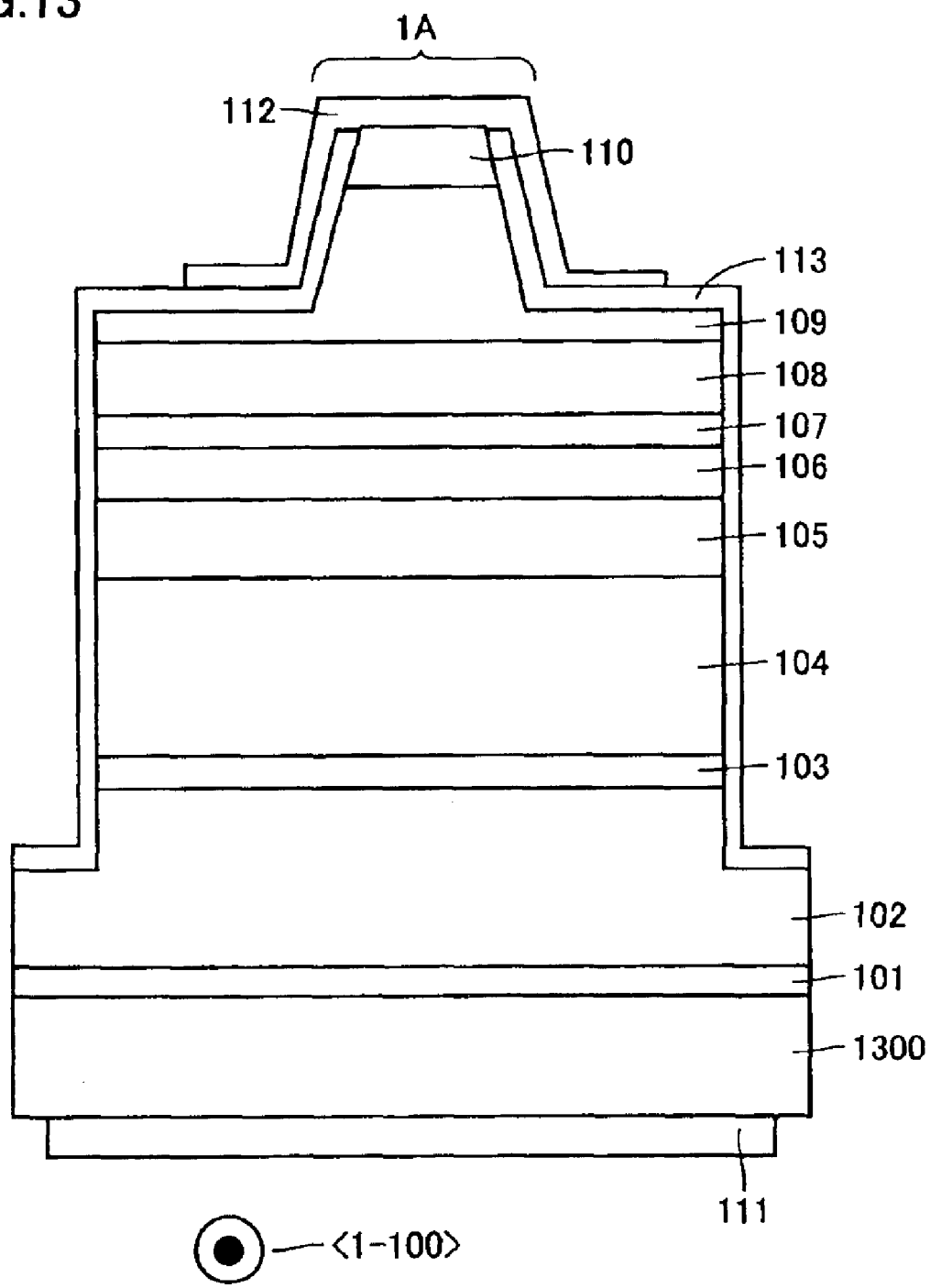
FIG. 13 is a schematic cross sectional view showing a structure of a laser device using a nitride semiconductor substrate in still another embodiment.

In the fourth embodiment shown in FIG. 13, an n type GaN substrate 1300 having a C plane ({0001} plane) as its main surface is employed instead of the sapphire substrate 100 employed in the first embodiment. When the GaN substrate is used, n type GaN layer 102 may be grown directly on the GaN substrate, with GaN buffer layer 101 omitted. With a GaN substrate commercially available at the present, however, it is preferable to insert the GaN buffer layer 101 to improve insufficient crystallinity and surface morphology of the GaN substrate.

In this fourth embodiment, since n type GaN substrate 1300 is used, n type electrode 111 can be formed on the back side of GaN substrate 1300. With the GaN substrate having its cloven end surface extremely smooth, a Fabry-Perot resonator having the resonator length of 300 μm can be formed with a low mirror loss. In general, the resonator length is preferably in a range of 300–1000 µm, similarly as in the first embodiment. The mirror end surfaces of the resonator are formed to correspond to the {1-100} plane of GaN substrate 1300. The cleavage and chip division into laser devices are carried out with a scriber on the substrate side, as in the case explained above in conjunction with FIG. 2. Further, the aforementioned DFB or TBR can of course be employed as the feedback method of the laser resonator, and a dielectric multilayer reflection film as in the first embodiment may also be formed on one of the mirror surfaces.

Use of the GaN substrate instead of the sapphire substrate allows thickening of n type AlGaN clad layer 104 and p type AlGaN clad layer 109, with no cracks created in the epitaxial wafer. Preferably, the thicknesses of the respective AlGaN clad layers are set in a range of 0.8–1.0 µm. This ensures a unimodal vertical transverse mode and improves the light confining efficiency, thereby enabling improvement in optical characteristics of the laser device and reduction of the laser threshold current density.

Further, when a nitride semiconductor laser diode device including a well layer is formed using the GaN substrate, crystal defect density (e.g., penetrating dislocation density) within the light emitting layer is decreased, and the lasing threshold current density is reduced by 10% to 20% compared to the case of the first embodiment where the sapphire substrate has been used (see FIG. 3).

Other conditions regarding the light emitting layer in the present embodiment are similar to those in the first embodiment. Regarding the impurity concentration in the light emitting layer, however, by modulation doping with which the impurity is added only in the barrier layer, or by adding the impurity of less than $3 \times 10^{18}/cm^3$ in the well layer, the laser threshold current density is reduced as compared with the first embodiment.

Fifth Embodiment

The fifth embodiment is similar to the first or fourth embodiment, except that sapphire substrate 100 in the first embodiment is replaced with a substrate 1400 shown in FIG. 14. The substrate 1400 in FIG. 14 includes a seed substrate 1401, a buffer layer 1402, an n type GaN film 1403, a dielectric film 1404 and an n type GaN thick film 1405 stacked in this order.

In forming the substrate 1400, firstly, buffer layer 1402 is stacked on seed substrate 1401 by MOCVD at a relatively low temperature of 550° C., and n type GaN film 1403 of 1 µm thickness is formed thereon with Si being doped at 1050° C.

The wafer having n type GaN film 1403 formed is taken out of the MOCVD system, followed by formation of dielectric film 1404 to a thickness of 100 nm by sputtering, CVD or EB (electron beam) evaporation. Dielectric film 1404 is then patterned to periodic stripes by lithography. The stripes extend along a <1-100> direction of n type GaN film 1403, and have periodic pitch of 10 µm and stripe width of 5 µm each along a <11-20> direction orthogonal to the <1-100> direction.

Next, the wafer having dielectric film stripes 1404 formed is set in an HVPE system, and n type GaN thick film 1405 having Si concentration of $1 \times 10^{18}/cm^3$ and a thickness of 350 µm is deposited at a growth temperature in a range of 1000–1100° C.

The wafer having n type GaN thick film 1405 formed is taken out of the HVPE system, and a laser diode similar to the one of the first embodiment (see FIG. 1) is formed thereon. In the fifth embodiment, however, the ridge stripe portion 1A of the laser diode is prevented from lying immediately above the lines 1410 and 1411 in FIG. 14, so that a resonator of the laser device is formed in a portion having a less penetrating dislocation density (or crystal defect density). The laser diode of the fifth embodiment thus formed has basically the same characteristics as the one of the fourth embodiment.

Substrate 1400 may be used as a substrate for laser diode after seed substrate 1401 is removed by a polishing machine, or after removal of buffer layer 1402 and all the layers thereunder by a polishing machine, or after dielectric film 1404 and all the layers thereunder are removed by a polishing machine. In the case that seed substrate 1401 is removed, n type electrode 111 can be formed on the back side of the substrate, similarly as in the fourth embodiment. Alternatively, seed substrate 1401 may be removed after the laser diode is formed.

In formation of substrate 1400 in FIG. 14, seed substrate 1401 may be formed of any of C-plane sapphire, M-plane sapphire, A-plane sapphire, R-plane sapphire, GaAs, ZnO, MgO, spinel, Ge, Si, 6H—SiC, 4H—SiC, 3C—SiC and others. Buffer layer 1402 may be formed of any of GaN layer, AlN layer, $Al_xGa_{1-x}N$ (0<x<1) layer and $In_yGa_{1-y}N$ (0<y<1) layer grown at a relative low temperature of 450–600° C. An n type $Al_zGa_{1-z}N$ (0<z<1) film may also be employed instead of n type GaN film 1403. As the dielectric film 1404, any of $SiO_2$ film, $SiN_x$ film, $TiO_2$ film and $Al_2O_3$ film may be used. The n type GaN thick layer 1405 may be replaced with an n type $Al_wGa_{1-w}N$ (0<w≦1) thick film with a thickness of at least 20 µm.

Sixth Embodiment

In the sixth embodiment, various kinds of materials are employed to form the light guide layer of the first embodiment. Although both n type light guide layer 105 and p type light guide layer 108 have been formed of GaN in the first embodiment, some of the nitrogen atoms in the GaN layers may be substituted with As, P or Sb atoms. That is, a light guide layer of $GaN_{1-x-y-z}As_xP_ySb_z$ (0≦x≦0.075, 0≦y≦0.1, 0≦z≦0.025, x+y+z>0 may be employed.

In the conventional AlGaN clad layer/GaN light guide layer, even if the Al content within the clad layer is increased, there is only a small difference between their refractive indices and further the lattice mismatch is increased adversely, resulting in occurrence of cracks and degradation of crystallinity. In the case of a combination of AlGaN clad layer and GaNAsPSb light guide layer, on the other hand, a small amount of addition of As, P or Sb increase the energy gap difference because of a significant bowing effect in the bandgap caused by the added element and also increase the refractive index difference, as compared to the conventional case. Accordingly, laser light can be confined efficiently in the nitride semiconductor laser diode device, and the (unimodal) characteristics of the vertical transverse mode improves.

The composition ratios of x, y and z in the $GaN_{1-x-y-z}As_xP_ySb_z$ (0≦x≦0.075, 0≦y≦0.1, 0≦z≦0.025, x+y+z>0) light guide layer may be adjusted so that the light guide layer can have its energy bandgap greater than that of the barrier layer in the light emitting layer. For example, in the case of $GaN_{1-x}As_x$ light guide layer in a violet laser device (wavelength: 410 nm), the composition ratio x of As is adjusted to less than 0.02. In the case of $GaN_{1-y}P_y$ light guide layer, the composition ratio y of P is adjusted to less than 0.03. In the case of $GaN_{1-z}Sb_z$ light guide layer, the composition ratio z of Sb is adjusted to less than 0.01. The conditions on the light emitting layer in the sixth embodiment are similar to those in the first embodiment.

Seventh Embodiment

Figure 15A:
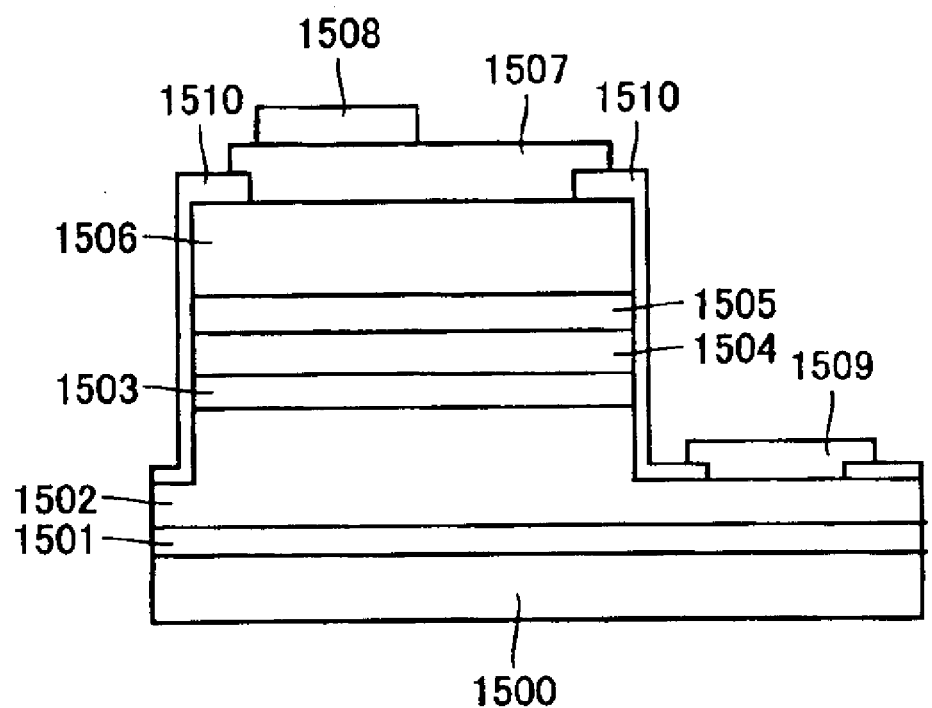
FIG. 15A is a schematic cross sectional view showing an example of a light emitting diode device according to still another embodiment.
Figure 15B:
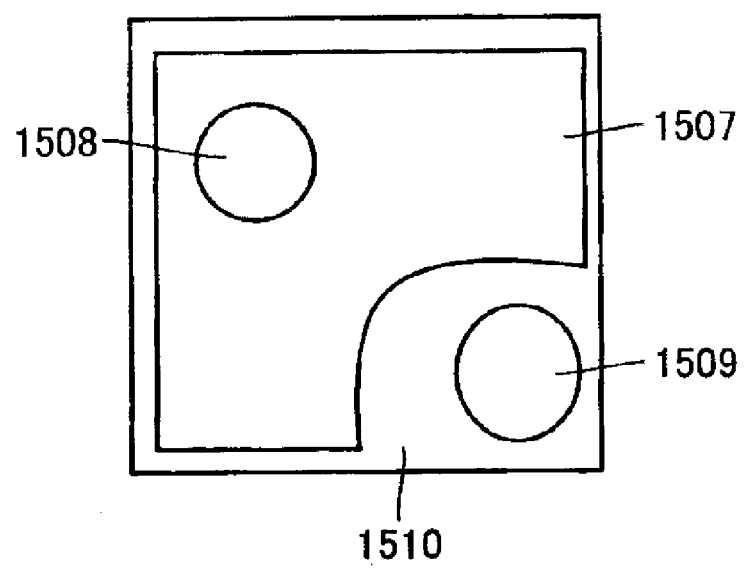
FIG. 15B is a schematic top plan view corresponding to the diode device of FIG. 15A.

The seventh embodiment is directed to a nitride semiconductor light emitting diode device. FIGS. 15A and 15B show a schematic cross sectional view and a schematic top plan view, respectively, of the nitride semiconductor light emitting diode device of the seventh embodiment.

The light emitting diode device of FIG. 15A includes a C-plane (0001) sapphire substrate 1500, a GaN buffer layer 1501 (thickness: 30 nm), an n type GaN contact layer 1502 (thickness: 3 μn, Si impurity concentration: $1 \times 10^{18}/cm^3$), an n type $Al_{0.1}Ga_{0.9}N$ shield and clad layer 1503 (thickness: 20 nm, Si impurity concentration: $1 \times 10^{18}/cm^3$), a light emitting layer 1504, a p type $Al_{0.1}Ga_{0.9}N$ shield and clad layer 1505 (thickness: 20 nm, Mg impurity concentration: $6 \times 10^{19}/cm^3$), a p type GaN contact layer 1506 (thickness: 200 nm, Mg impurity concentration: $1 \times 10^{20}/cm^3$), a transparent p type electrode 1507, a pad electrode 1508, an n type electrode 1509, and a dielectric film 1510.

In this light emitting diode device, n type $Al_{0.1}Ga_{0.9}N$ shield and clad layer 1503 may be omitted. Further, p type electrode 1507 may be formed of Ni or Pd, pad electrode 1508 may be formed of Au, and n type electrode 1509 may be formed of laminated film of Hf/Au, Ti/Al, Ti/Mo or Hf/Al.

In the light emitting layer 1504 of the present embodiment, Si is added in the well layer and in the barrier layer at a concentration of $5 \times 10^{17}/cm^3$. These well and barrier layers are formed of the nitride semiconductor materials similar as in the second embodiment. When sapphire substrate 1500 is replaced with a GaN substrate, the same effects as in the fourth embodiment can be obtained, and the same effects as in the fifth embodiment are obtained using the substrate shown in FIG. 14. Further, with the conductive GaN substrate, p type electrode 1507 and n type electrode 1509 may be formed on the same side of the light emitting device as shown in FIG. 15B and alternatively the n type electrode may be formed on the back side of the GaN substrate with the transparent p type electrode being formed on the epitaxial outermost surface.

Other conditions on the well layer and the barrier layer included in light emitting layer 1504 in the seventh embodiment are similar to those in the first embodiment.

Eighth Embodiment

The eighth embodiment is directed to a nitride semiconductor super-luminescent diode device. The configuration and crystal growth method in this light emitting device are similar as in the first embodiment. The effects as in the fourth embodiment are obtained when the sapphire substrate is replaced with a GaN substrate. The effects as in the fifth embodiment are obtained when a substrate as shown in FIG. 14 is employed.

Ninth Embodiment

In the ninth embodiment, impurity C of $1 \times 10^{20}/cm^3$ is added instead of Si in the well and barrier layers of the light emitting layers of the first and third through eighth embodiments. The similar effects are obtained when impurity Si is replaced with C in the well and barrier layers.

Tenth Embodiment

In the tenth embodiment, Mg of $1 \times 10^{16}/cm^3$, instead of Si, is added in the well and barrier layers of the light emitting layers of the first and third through eighth embodiments. The similar effects are obtained when impurity Si is replaced with Mg in the well and barrier layers.

Eleventh Embodiment

A conventional light emitting layer and an inventive light emitting layer according to the eleventh embodiment are firstly compared and thereafter the present embodiment (laser diode) will be explained.

Analysis by SIMS (secondary ion mass spectroscopy) was carried out to know interface states of the conventional GaNAs well layer/GaN barrier layer disclosed in Japanese Patent Laying-Open No. 10-270804.

When the well layer and the barrier layer were both formed at a temperature within a proper growth temperature range (600–800° C.) of the GaNAs well layer, the As concentration changed steeply at the interface of the GaN barrier layer on the GaNAs well layer, while the steepness of the As concentration change was considerably impaired at the interface of the GaNAs well layer on the GaN barrier layer.

On the other hand, when the well layer was formed at a temperature within the proper growth temperature range (600–800° C.) of the GaNAs well layer and the barrier layer was formed at a proper growth temperature (greater than 900° C.) of the GaN layer, the As concentration changed steeply in the interface of the GaNAs well layer on the GaN barrier layer, whereas the steepness was considerably impaired in the interface of the GaN barrier layer on the GaNAs well layer.

From the foregoing, with the light emitting device employing the conventional GaNAs well layer/GaN barrier layer, it was impossible to improve steepness at the interface, or interfacial steepness, of the GaNAs well layer on the GaN barrier layer and the interfacial steepness of the GaN barrier layer on the GaNAs well layer at the same time, even if the growth conditions (growth temperatures) were controlled. That is, the conventional light emitting layer suffered increase of the half-width of emission peak (increase of mottling) and decrease of luminous intensity (or increase of threshold current density) attributable to the disturbed interfaces. In addition, impairment of the steepness at the interface between the well and barrier layers suggested difficulty in forming the multiple quantum well structure with these layers. The above-described matter occurred not only in the case of the GaNAs well layer/GaN barrier layer, but also in the cases of GaNP well layer/GaN barrier layer and GaNSb well layer/GaN barrier layer.

(Light Emitting Layer)

In the eleventh embodiment, the above-described problems are solved by adding In in a nitride semiconductor barrier layer in contact with a GaNAs well layer (or a $GaN_{1-x-y-z}As_xP_ySb_z$ well layer ($0<x+t+z\leq0.3$)). Here, the nitride semiconductor barrier layer including In refers to a barrier layer formed of InGaN, InGaNAs, InGaNP, InGaNSb, InGaNAsP, InGaNAsPSb or the like.

Figure 22:
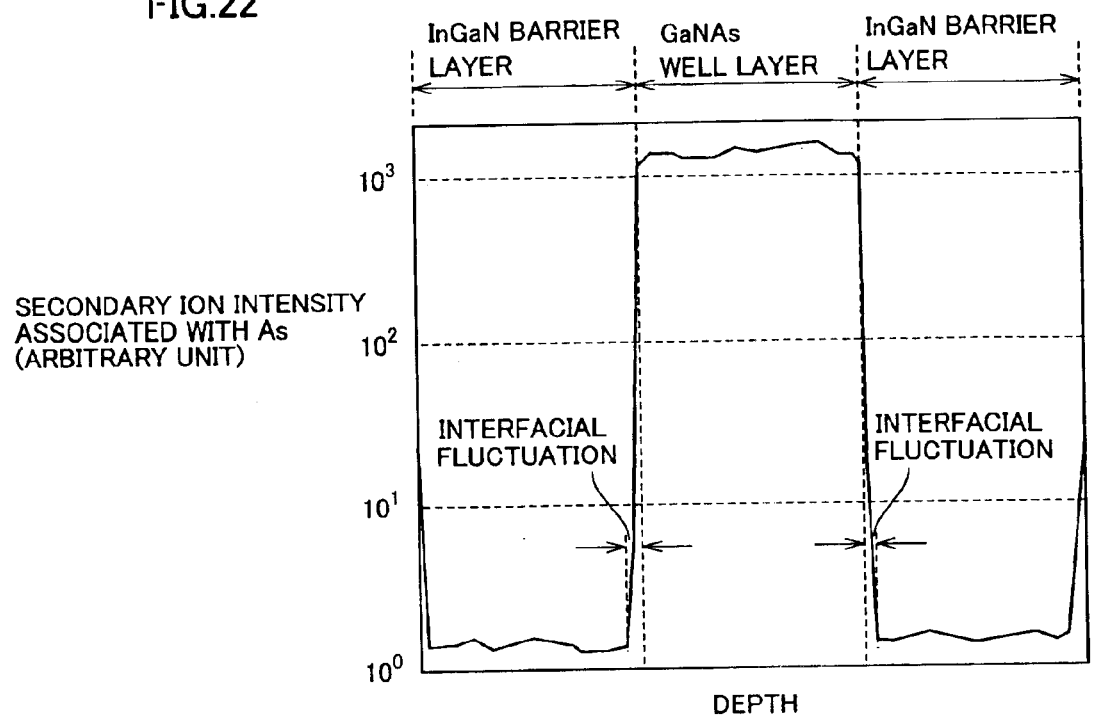
FIG. 22 is a graph showing SIMS (secondary ion mass spectroscopy) results associated with As within a GaNAs well layer/InGaN barrier layer structure according to still anothrer embodiment.
Figure 23:
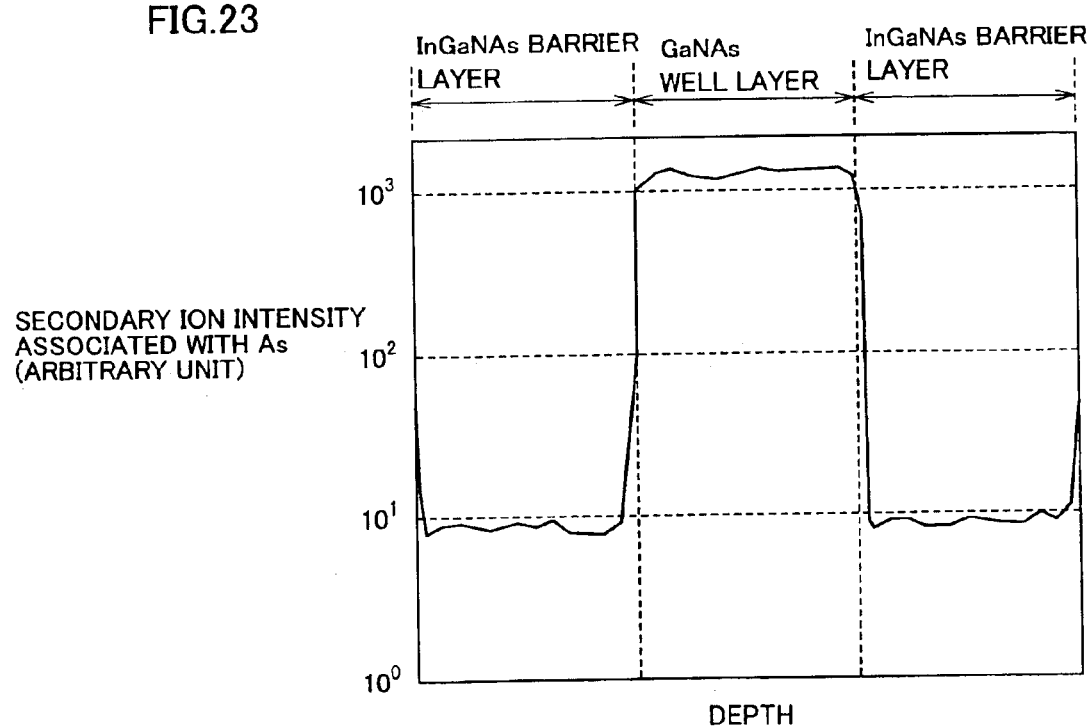
FIG. 23 is a graph showing SIMS results regarding As in a GaNAs well layer/InGaNAs barrier layer structure of still another embodiment.
Figure 24:
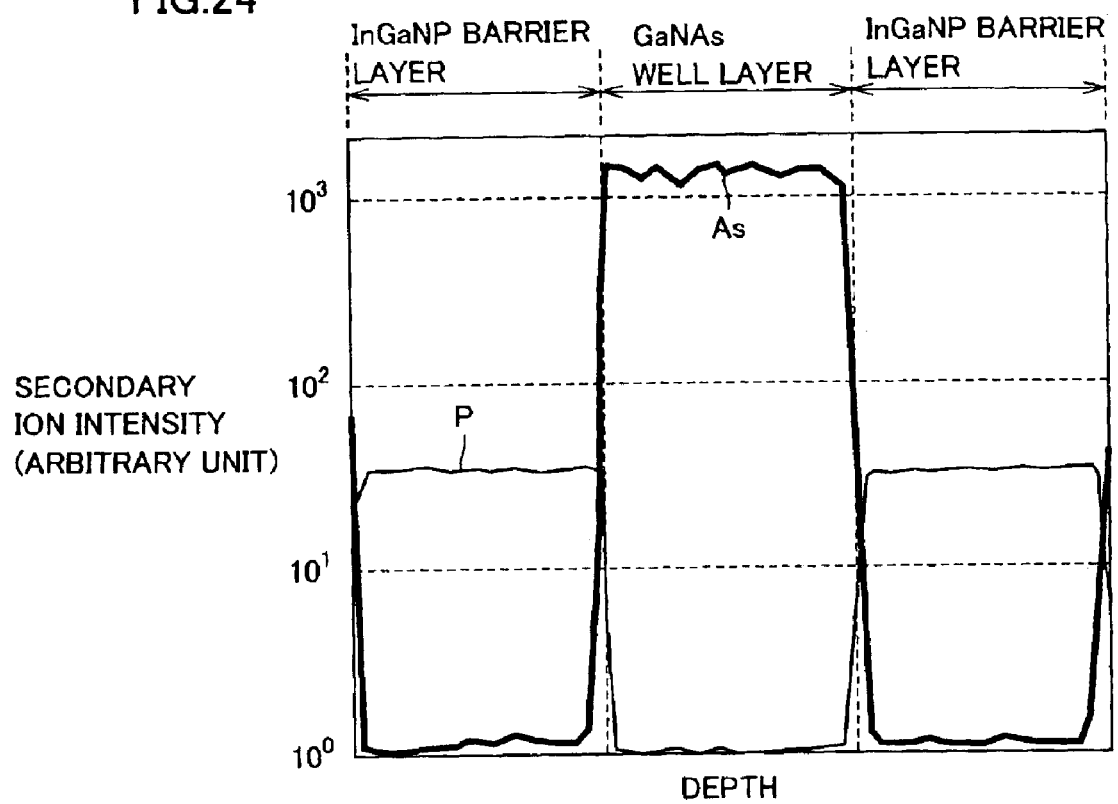
FIG. 24 is a graph showing SIMS results regarding As and P in a GaNAs well layer/InGaNP barrier layer structure of still another embodiment.

The SIMS results of the light emitting layer of the present embodiment are explained in conjunction with FIGS. 22–24.

FIG. 22 shows the SIMS results when a GaNAs well layer and an InGaN barrier layer were formed at the same growth temperature (800° C.). As seen from FIG. 22, the steepness at the interface is improved by using the barrier layer of the present embodiment, suggesting that it is possible to form a multiple quantum well structure with these layers. The same effect can be obtained with the well layer of any of GaNP, GaNSb, GaNAsP and GaNAsPSb. The growth temperatures of the well and barrier layers need not be exactly the same with each other. The same results as shown in FIG. 22 can be obtained when they are within a range of 600–800° C.

FIG. 23 shows the SIMS results when a GaNAs well layer and a InGaNAs barrier layer were formed at the same growth temperature (800° C.). As seen from FIG. 23, the steepness at the interface is improved by using the barrier layer of the present embodiment. This also means that a multiple quantum well structure can be formed of these layers. The similar SIMS results can be obtained when the combination of well layer/barrier layer is any of GaNP well layer/InGaNP barrier layer, GaNSb well layer/InGaNSb barrier layer, GaNAsP well layer/InGaNAsP barrier layer, and GaNAsPSb well layer/InGaNAsPSb barrier layer. The well and barrier layers need not be grown at the same temperature. The results as shown in FIG. 23 can be obtained with the growth temperatures in the range of 600–800° C.

FIG. 24 shows the SIMS results when a GaNAs well layer and an InGaNP barrier layer were formed at the same growth temperature (800° C.). As seen from FIG. 24, the steepness at the interface is again improved by using the barrier layer of the present embodiment. This also means that a multiple quantum well structure can be formed of these layers. The steep SIMS waveforms as in FIG. 24 can be obtained when the combination of well layer/barrier layer is any of GaNAs well layer/InGaNAsP barrier layer, GaNP well layer/InGaNAs barrier layer, GaNP well layer/InGaNAsP barrier layer, GaNAsP well layer/InGaNAs barrier layer, and GaNAsP well layer/InGaNP barrier layer. The growth temperatures of the well and barrier layers need not be the same with each other. The same results as shown in FIG. 24 can be obtained with the growth temperatures in the range of 600–800° C.

($GaN_{1-x-y-z}As_xP_ySb_z$ Well Layer)

The $GaN_{1-x-y-z}As_xP_ySb_z$ well layer according to the nitride semiconductor light emitting device of the eleventh embodiment corresponds to a GaN crystal with at least one element selected from As, P and Sb added therein. The total added amount of these elements x+y+z (composition ratio) is less than 30%, and preferably less than 20%. If the total added amount x+y+z of As, P and Sb is greater than 20%, concentration separation will gradually occur where the composition ratio of As, P or Sb becomes different in local regions within the well layer. If it exceeds 30%, the concentration separation proceeds further to cause crystal system separation where a hexagonal system and a cubic system coexist. Such crystal system separation considerably impairs the steepness at the interface between the well layer and the barrier layer. Further, if the ratio of regions suffering the crystal system separation becomes more than about 50% in the well layer, crystallinity of the well layer will also be degraded considerably.

The lower limit of the total added amount x+y+z is not specifically set from the standpoint of the interfacial steepness between the well and barrier layers in the present embodiment. However, if it is less than 0.01%, there is a probability that it becomes difficult to obtain the effect of adding As, P or Sb in the well layer (i.e., reduction of threshold current density or improvement of luminous intensity). If the total added amount x+y+z becomes more than 0.1%, the effect of adding As, P or Sb in the well layer (reduction of threshold current density or improvement of luminous intensity) becomes significant.

(In Content in Barrier Layer)

Figure 25:
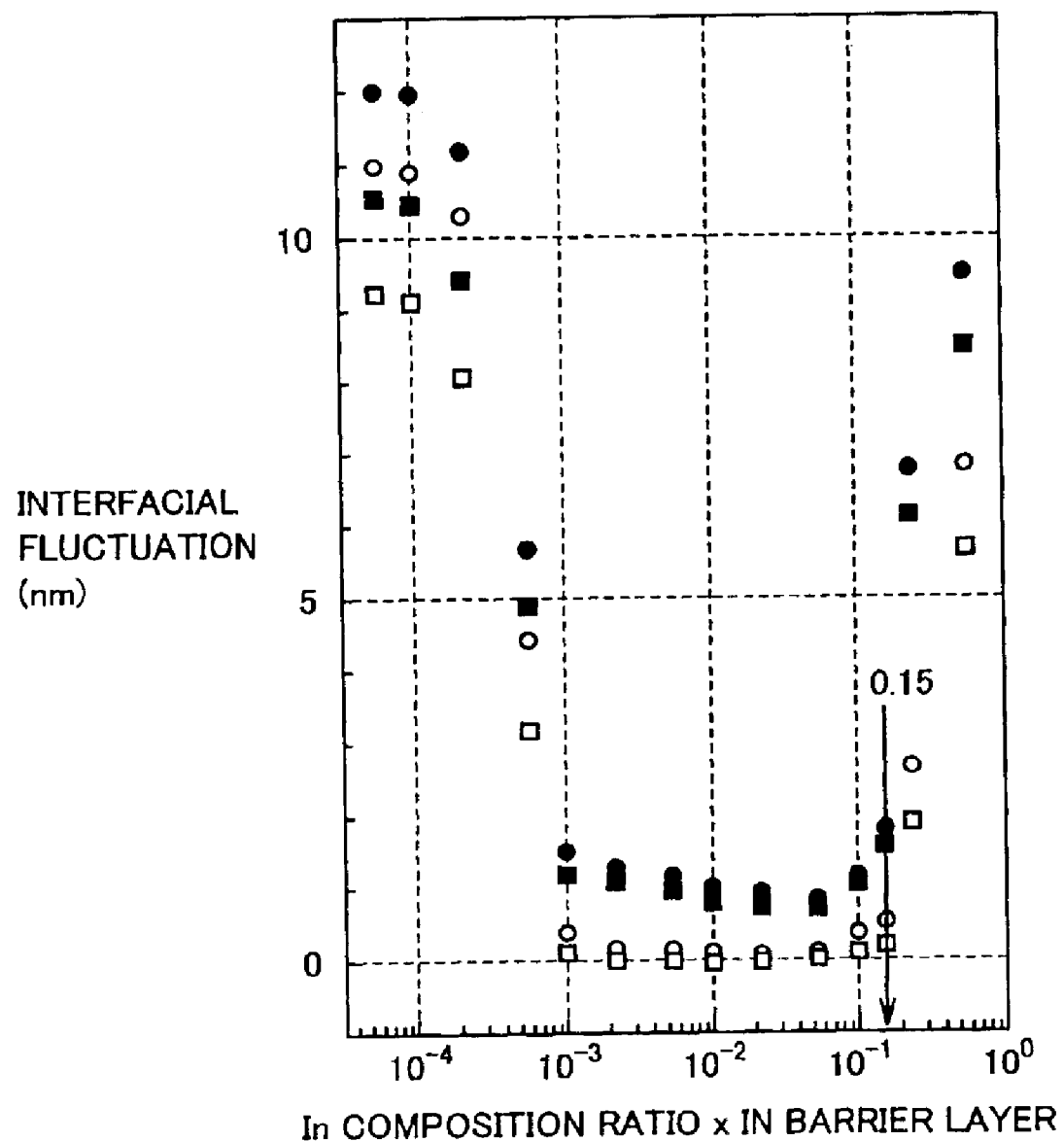
FIG. 25 is a graph showing interfacial fluctuation depending on a composition ratio x of In within the barrier layer.

FIG. 25 shows measurement results of interfacial fluctuation with respect to the In composition ratio in the light emitting layer having a GaNAs well layer/$In_xGa_{1-x}N$ barrier layer structure or a GaNP well layer/$In_xGa_{1-x}N$ barrier layer structure. FIG. 25 also shows dependence of the interfacial fluctuation with respect to the substrate on which the light emitting layer is stacked.

Here, the interfacial fluctuation is represented as a depth (layer thickness) from a point where the secondary ion intensity obtained by SIMS is the greatest to another point where it is the smallest (see FIG. 22). White circles in FIG. 25 represent results of the light emitting layer formed of GaNP well layer/$In_xGa_{1-x}N$ barrier layer grown on a GaN substrate (as an example of the nitride semiconductor substrate), and black circles represent results of the light emitting layer formed of GaNP well layer/$In_xGa_{1-x}N$ barrier layer grown on a sapphire substrate (as an example of the substrate other than the nitride semiconductor substrate). White squares in FIG. 25 represent results of the light emitting layer formed of GaNAs well layer/$In_xGa_{1-x}N$ barrier layer grown on a GaN substrate, and black squares represent results of the light emitting layer formed of GaNAs well layer/$In_xGa_{1-x}N$ barrier layer grown on a sapphire substrate.

Referring to FIG. 25, the interfacial fluctuation starts to be improved when the In composition ratio x in the barrier layer becomes more than $2 \times 10^{-4}$, regardless of the kinds of substrate and well layer (though the well layer is limited to $GaN_{1-x-y-z}As_xP_ySb_z$ well layer ($0<x+t+z \leq 0.3$)). The interfacial fluctuation becomes constant when the In composition ratio x reaches 0.001, and it increases when the In composition ratio x exceeds 0.15. More specifically, in the light emitting layer grown on the GaN substrate, the interfacial fluctuation is small with the In composition ratio x of up to about 0.2. The interfacial fluctuation increases when the In composition ratio becomes too high, presumably because of the phase separation which occurs due to the In segregation. Thus, a preferable In composition ratio in the group III elements in the nitride semiconductor barrier layer is more than 0.1% and less than 15%. The half-width of emission peak at this time was decreased by at least about 50% compared to the case of a nitride semiconductor barrier layer not containing In. The effect as shown in FIG. 25 can be obtained when the well layer is formed of GaNSb. The same effect can also be obtained when the nitride semiconductor barrier layer includes As, P or Sb.

(Barrier Layer)

Any of InGaN, InGaNAs, InGaNP, InGaNSb, InGaNAsP and InGaNAsPSb may be employed for a preferable nitride semiconductor barrier layer of the eleventh embodiment. The InGaN barrier layer is preferable as it can readily be formed by changing only the In supply amount.

The barrier layer formed of InGaNAs, InGaNP, InGaNSb, InGaNAsP or InGaNAsPSb, corresponding to InGaN with at least one of As, P and Sb contained therein, is preferred in the following points. The As, P and Sb atoms exhibit very high adsorption rates with respect to the group III atoms compared to the N atoms, so that they easily bond with Ga atoms which have not been bonded with the N atoms and left within the barrier layer (thereby preventing vacancies due to escape of N). Further, the As, P and Sb atoms each have their larger atomic radii than the N atom, so that they can prevent escape of N in the barrier layer. In addition, since the In atom has its atomic radius greater than that of the Ga atom, it is conceivably difficult that the As, P and Sb atoms added in the barrier layer escape from the barrier layer. These all contribute to improvement in crystallinity of the barrier layer, and further to improvement in the interfacial steepness of the light emitting layer. Preferably, a total sum of the composition ratios of As, P and Sb in the group V elements within the nitride semiconductor barrier layer is more than $2 \times 10^{-5}$% and less than 20%, where $2 \times 10^{-5}$% corresponds to $1 \times 10^{16}$ atoms/cm$^3$. Attention should also be given so that the bandgap energy of the barrier layer may not be lower than that of the well layer. If the total sum of the composition ratios of As, P and Sb is less than $2 \times 10^{-5}$%, it is difficult to obtain the above-described effect by adding As, P or Sb in the nitride semiconductor barrier layer. The total sum of greater than 20% is not preferred, since the crystallinity of the barrier layer is degraded. Further, if the components constituting the barrier layer are all included in the components constituting the well layer, the well layer can be formed by stopping supply of In to the barrier layer. That is, the interfacial steepness in the light emitting layer can readily be controlled without changing the materials for group V elements. Such a light emitting layer may be, e.g., GaNAs well layer/InGaNAs barrier layer, GaNP well layer/InGaNP barrier layer, GaNSb well layer/InGaNSb barrier layer, or GaNAsP well layer/InGaNAsP barrier layer.

Further, since the nitride semiconductor barrier layer of the eleventh embodiment includes In and at least one element of As, P and Sb in GaN, the bandgap energy of the barrier layer can be made smaller than that of the GaN light guide layer (see FIGS. 4A and 4B). This is advantageous in that the multiple quantum well effect by sub-bands is easier to be obtained than in the light emitting layer (FIG. 6) of the prior art (Japanese Patent Laying-Open No. 10-270804), the refractive index also becomes greater than that of the light guide layer, leading to increased light confining efficiency, and the (unimodal) characteristic of the vertical transverse mode improves.

(Substrate for Growing Light Emitting Device)

The barrier layer included in the light emitting layer of the eleventh embodiment contains In, while the phase separation due to In segregation is liable to occur with increase of the In composition ratio in the crystal. In the phase separation, regions having high In composition ratios and regions having low In composition ratios are formed in the barrier layer, leading to an irregular interface with the well layer grown thereon. This can explain the reason why the interfacial fluctuation becomes large with increase of the In composition ratio (i.e., In composition ratio x of greater than 0.15 when a sapphire substrate is employed, and In composition ratio x of greater than 0.2 when a GaN substrate is employed) in FIG. 25. Thus, to improve the interfacial steepness between the well layer and the barrier layer in the present embodiment, it is necessary to control the In content (FIG. 25), and to prevent In segregation thereby suppressing the phase separation.

To prevent the In segregation, the defect density within the crystal needs to be decreased, since the In segregation is liable to occur near the defects. Further, according to knowledge of the inventors, it has been found that As, P and Sb are also liable to segregate near the defects, thereby degrading crystallinity of the well layer (which leads to degradation of luminous efficiency of the light emitting layer and an increase of the threshold current density). That is, the defect density in the crystal should be reduced not only in the barrier layer but also in the well layer.

A specific way of reducing the defect density is to select a substrate for growing the light emitting layer thereon. According to the knowledge of the inventors, the most preferable substrate is a nitride semiconductor substrate (in particular, GaN substrate). A nitride semiconductor film grown on the nitride, semiconductor substrate had an etch pit density of less than about $5 \times 10^7/cm^2$, which is smaller than the etch pit density (more than about $4 \times 10^8/cm^2$) of sapphire substrate or SiC substrate used as the substrate of a conventional nitride semiconductor light emitting device. Here, the etch pit density is measured as follows. An epi-wafer (light emitting device) is immersed in an etching solution of phosphoric acid and sulfuric acid of 1:3 (at 25° C.) for 10 minutes, and pit density formed on the wafer surface is measured. This etch pit density obtained by measuring the pit density on the epi-wafer surface may not exactly show the density of defects in the light emitting layer. However, the measurement of the etch pit density can indicate whether there are a large number of defects in the light emitting layer or not, since the density of defects in the light emitting layer increases as the etch pit density increases.

The next favorable substrate is a pseudo GaN substrate. The method of forming the pseudo GaN substrate will be described in detail later in the twelfth embodiment. The nitride semiconductor film grown on the pseudo GaN substrate had an etch pit density of less than about $7 \times 10^7/cm^2$ in a region of the lowest density, which was close to the etch pit density of the nitride semiconductor film grown on the nitride semiconductor substrate. However, with the pseudo GaN substrate having regions with low etch pit density and regions with high etch pit density coexistent, the yield of the light emitting devices is liable to decrease compared to the case of using the nitride semiconductor substrate. On the other hand, the pseudo GaN substrate is advantageous in that it is less expensive than the nitride semiconductor substrate and can be formed with a large area.

The light emitting layer of the present embodiment grown on a GaN substrate (as an example of the nitride semiconductor substrate) is again explained in conjunction with FIG. 25. As seen from FIG. 25, the light emitting layer grown on the GaN substrate has interfacial fluctuation less than in the light emitting layer grown on a sapphire substrate (as an example of the substrate other than the nitride semiconductor substrate), and has small interfacial fluctuation even with the In composition ratio x of 0.2. This presumably is because the In segregation in the barrier layer was suppressed by reduction of the defect density. The relation between the In composition ratio and the interfacial fluctuation in the case of using the pseudo GaN substrate is almost the same as in the case of using the GaN substrate in FIG. 25.

Figure 26:
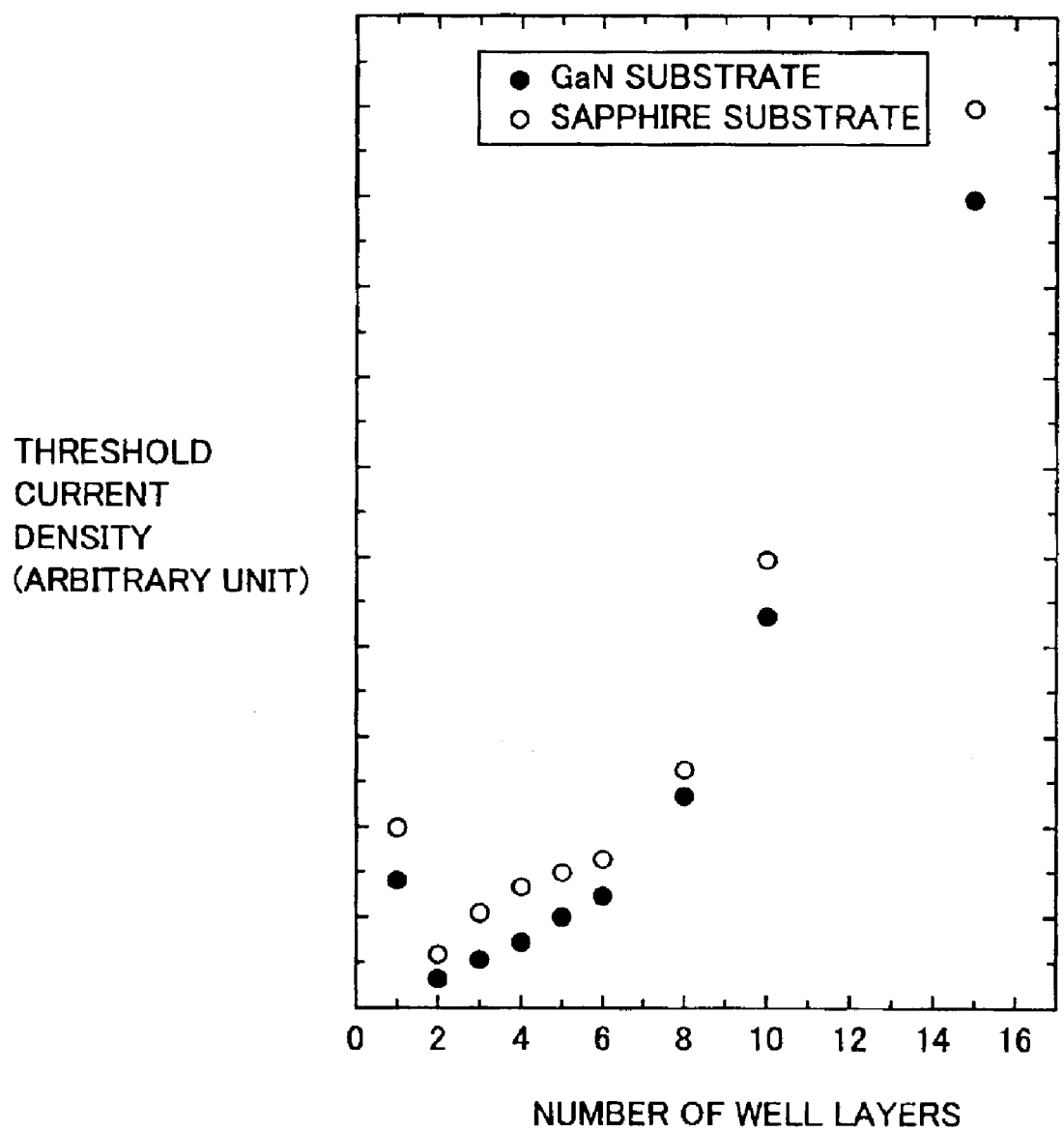
FIG. 26 is a graph showing the relation between the number of well layers and the threshold current density of the laser devices.
Figure 27:
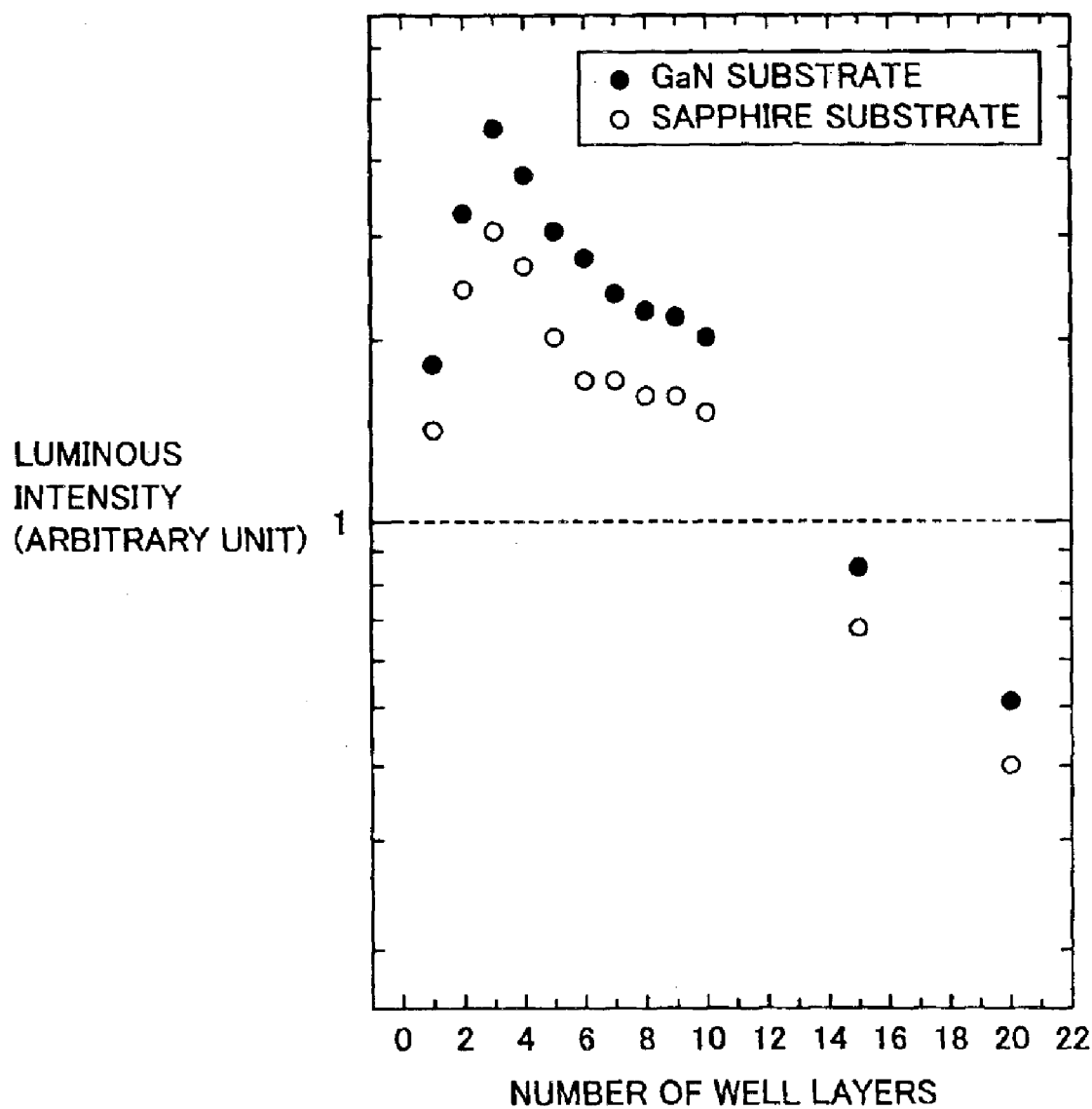
FIG. 27 is a graph showing the relation between the number of well layers and luminous intensity of the light emitting diodes.

On the other hand, the effect of suppressing segregation of As, P and Sb in the light emitting layer by utilizing the GaN substrate contributes to reduction of threshold current density in the case of a laser diode, and contributes to an increase of luminous intensity in the case of a light emitting diode, as seen from FIGS. 26 and 27.

(Impurities)

According to the photoluminescence (PL) measurement, PL luminous intensity increased about 1.2–1.4 times when Si was added in the light emitting layer (in both the barrier and well layers). This means that it is possible to improve the characteristics of the light emitting device by adding the impurity in the light emitting layer. The well layer of the eleventh embodiment is a crystal not containing In, and thus a local energy level due to In is not generated. In such a case, luminous intensity strongly depends on crystallinity of the well layer (the barrier layer in contact with the well layer also needs to have good crystallinity to ensure good crystallinity of the well layer).

Thus, it is considered that addition of the impurity such as Si has served to improve the crystallinity of the light emitting layer. The similar effect can be obtained by adding any of O, S, C, Ge, Zn, Cd and Mg instead of Si. All that is needed is that a total dose of impurities is $1 \times 10^{16}/cm^3$ to $1 \times 10^{20}/cm^3$. That is, a plurality of kinds of impurities may be added at the same time. If the dose of impurities is less than $1 \times 10^{16}/cm^3$, the luminous intensity is not improved. If it is greater than $1 \times 10^{20}/cm^3$, defect density within the crystal increases because of the added impurities themselves, leading to undesirable degradation of the luminous intensity.

In particular, the effect of adding the impurities was remarkable in the case that the crystal growth was performed on a substrate other than the nitride semiconductor, e.g., on a sapphire substrate and then defects in the light emitting layer were liable to increase (etch pit density: $4\times10^8/cm^2$ or more).

(Number of Well Layers)

In the nitride semiconductor light emitting device according to the eleventh embodiment, interfacial steepness of conventional GaNAs well layer/GaN barrier layer or the like is improved by utilizing the nitride semiconductor barrier layer containing In. That the interfacial steepness between the well layer and the barrier layer is good means that it is possible to form a multiple quantum well structure with these layers, and that favorable characteristics will be obtained with such a multiple quantum well structure.

FIG. 26 shows the relation between the number of well layers included in the light emitting layer (multiple quantum well structure) and the laser threshold current density. The light emitting layer used in FIG. 26 includes a $GaN_{0.97}P_{0.03}$ well layer and an $In_{0.01}Ga_{0.99}N$ barrier layer. White circles and black circles in the drawing represent laser threshold current densities in the case that a sapphire substrate and a GaN substrate are employed, respectively. The method of forming a laser diode device on the GaN substrate will be described later in this embodiment. The method of forming a laser diode device on the sapphire substrate is the same as will be described below in the twelfth embodiment.

Referring to FIG. 26, the threshold current density is small when the number of well layers is 10 or less, irrespective of the kind of substrate, enabling continuous lasing at the room temperature. The well layers of at least 2 and at most 6 are preferable to further reduce the lasing threshold current density. It has been found that a desirable multiple quantum well structure can be obtained by employing the barrier layer of the present embodiment.

Further, it has been found that the laser diode device using the GaN substrate has a lower threshold current density than the one using the sapphire substrate, as shown in FIG. 26. This presumably is because of improved interfacial fluctuation as a result of suppression of segregation due to In near the defects in the barrier layer (FIG. 25), and also because of improved crystallinity as a result of suppression of segregation of As, P or Sb near the defects in the well layer. The relation between the number of well layers and the threshold current density in the case of employing a pseudo GaN substrate is almost the same as in the case of employing the GaN substrate in FIG. 26. Although the light emitting layer formed of GaN0.97P0.03 well layer/In0.01Ga0.99N barrier layer has been explained in FIG. 26, the relation between the number of well layers and the threshold current density as in FIG. 26 can be obtained using any other light emitting layer, as long as it satisfies the requirements of the eleventh embodiment.

Now, dependence of luminous intensity of a light emitting diode with a multiple quantum well using the light emitting layer of the present embodiment with respect to a substrate and to a number of well layers is explained with reference to FIG. 27. The light emitting layer used in FIG. 27 includes $GaN_{0.94}P_{0.06}$ well layer/$In_{0.01}Ga_{0.99}N_{0.995}P_{0.005}$ barrier layer. The luminous intensity in FIG. 27 is normalized with the luminous intensity (broken line) of a light emitting diode including a light emitting layer of n type GaN layer/$GaN_{0.94}P_{0.06}$ single quantum well layer/p type GaN layer. White circles and black circles in the drawing represent the luminous intensities in the case of employing a sapphire substrate and a GaN substrate, respectively. The methods of forming the light emitting diode devices on the GaN substrate and on the sapphire substrate are the same as will be described below in the fourteenth embodiment.

It has been found from FIG. 27 that the luminous intensity increases when the number of well layers is at least 2 and at most 10, regardless of the kind of substrate. Further, it has been found that the luminous intensity improves using the GaN substrate rather than the sapphire substrate. This presumably is because interfacial fluctuation was improved (FIG. 25) as segregation of In was suppressed near the defects in the barrier layer and also because crystallinity was improved as segregation of As, P or Sb was suppressed near the defects in the well layer. The relation between the number of well layers and the luminous intensity in the case of using a pseudo GaN substrate is approximately the same as in the case of using the GaN substrate shown in FIG. 27. The same effect as in FIG. 27 can be obtained also in a super-luminescent diode device. Although the light emitting layer formed of $GaN_{0.94}P_{0.06}$ well layer/$In_{0.01}Ga_{0.99}N_{0.995}P_{0.005}$ barrier layer has been explained in FIG. 27, any other light emitting layer satisfying the requirements of the eleventh embodiment can obtain the similar relation of the number of well layers and the luminous intensity as shown in FIG. 27.

(Thicknesses of Well Layer and Barrier Layer)

Preferably, the well layer and the barrier layer of the eleventh embodiment grown on a substrate (e.g., sapphire substrate or SiC substrate) other than a nitride semiconductor each have a thickness of at least 3 nm and at most 20 nm. If the well layer is thinner than 3 nm, it becomes susceptible to interfacial fluctuation. Referring to FIG. 25, the interfacial fluctuation of the light emitting layer grown on a substrate other than the nitride semiconductor is within a thickness of at most about 1.5 nm with In composition ratio x in a range of 0.001–0.15. Thus, it is preferred that the well layer has a thickness of at least 3 nm. On the other hand, if the well layer is thicker than 20 nm, it becomes difficult to obtain the quantum well effect. When the barrier layer is thinner than 3 nm, it becomes susceptible to the interfacial fluctuation, as in the case of the well layer. If the barrier layer is thicker than 20 nm, the outermost surface of the barrier layer is liable to become rough, though depending on the In content.

Preferably, the well layer of the eleventh embodiment grown on a nitride semiconductor substrate (e.g., GaN substrate) has a thickness of at least 0.4 nm and at most 20 nm, and the barrier layer has a thickness of at least 1 nm and at most 20 nm. When the light emitting layer is grown on the nitride semiconductor substrate (see FIG. 25), the interfacial fluctuation is considered to be approximately 0 nm with the In composition ratio x in the range of 0.001–0.15. Thus, the lower limit in thickness is not constrained by the interfacial fluctuation, differently from the case of employing a substrate other than the nitride semiconductor. If the well layer is thinner than 0.4 nm, however, the carrier confinement level by the quantum well effect becomes too high, thereby degrading the luminous efficiency. If the well layer is thicker than 20 nm, it becomes difficult to obtain the quantum well effect. If the barrier layer is thinner than 1 nm, steepness in the interface due to addition of In can not be obtained sufficiently. If the barrier layer is thicker than 20 nm, the outermost surface of the barrier layer is liable to become rough, though depending on the In content.

(Crystal Growth)

Figure 16:
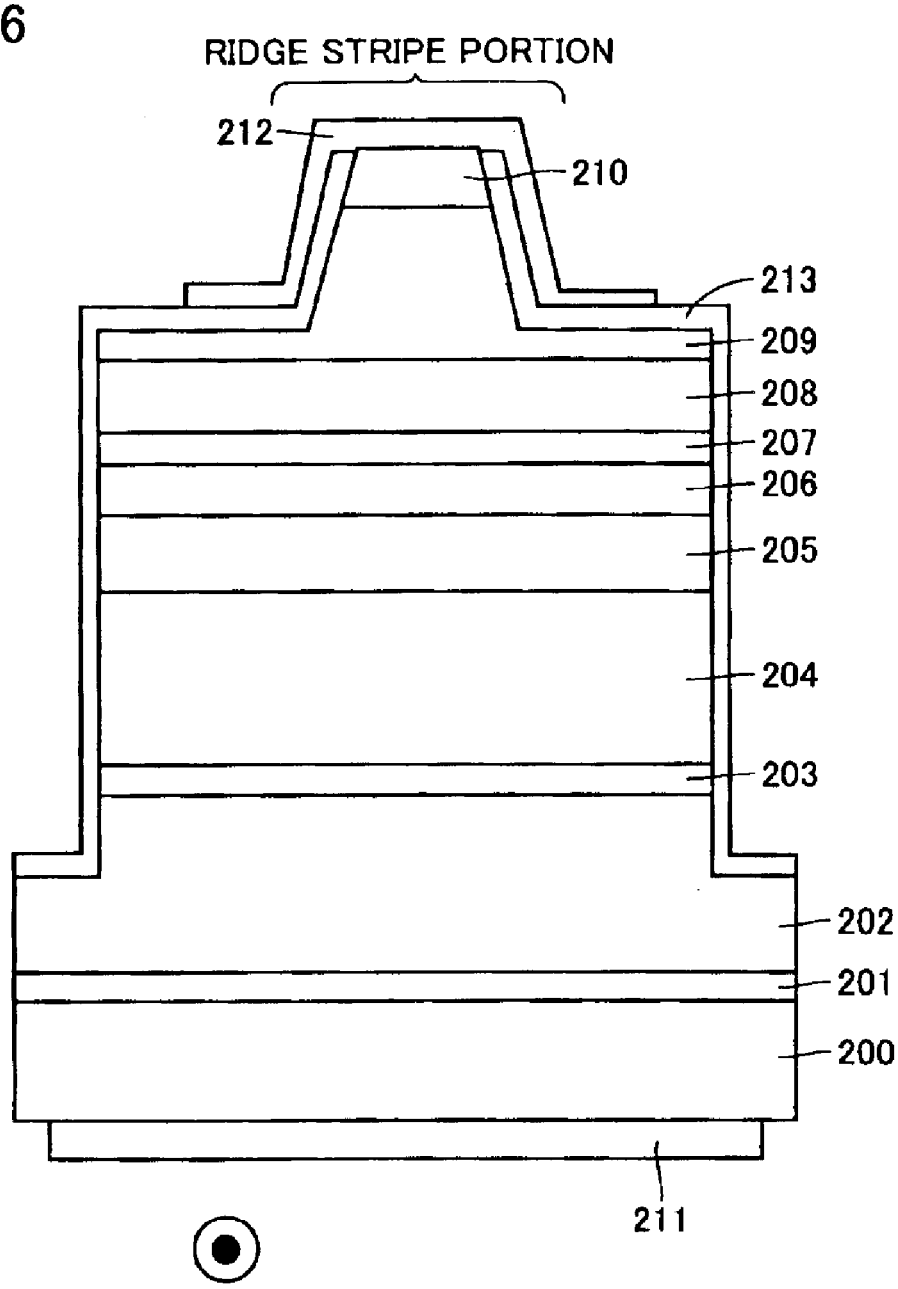
FIG. 16 is a schematic cross sectional view showing a structure of a nitride semiconductor laser device according to still another embodiment.

The nitride semiconductor laser device according to the eleventh embodiment shown in FIG. 16 includes a C-plane (0001) n type GaN substrate 200, a low-temperature GaN buffer layer 201, an n type GaN layer 202, an n type $In_{0.07}Ga_{0.93}N$ anti-crack layer 203, an n type $Al_{0.1}Ga_{0.9}N$ clad layer 204, an n type GaN light guide layer 205, a light emitting layer 206, a p type $Al_{0.2}Ga_{0.8}N$ carrier block layer 207, a p type GaN light guide layer 208, a p type $Al_{0.1}Ga_{0.9}N$ clad layer 209, a p type GaN contact layer 210, an n electrode 211, a p type electrode 212, and a $SiO_2$ dielectric film 213.

Firstly, n type GaN substrate 200 is set in a MOCVD system, and $NH_3$ as a source material for group V element and TMGa as a source material for group III element are used to grow low-temperature GaN buffer layer 201 to a thickness of 100 nm at a growth temperature of 550° C. Next, $SiH_4$ is added to $NH_3$ and TMGa at a growth temperature of 1050° C. to form n type GaN layer 202 (Si impurity concentration: $1 \times 10^{18}/cm^3$) to a thickness of 3 $\mu$m. Subsequently, the growth temperature is lowered to 700–800° C., and TMIn as a source material for group III element is supplied to grow n type $In_{0.07}Ga_{0.93}N$ anti-crack layer 203 to a thickness of 40 nm. The substrate temperature is increased again to 1050° C., and TMAl as a source material for group III element is used to grow n type $Al_{0.1}Ga_{0.9}N$ clad layer 204 (Si impurity concentration: $1 \times 10^{18}/cm^3$) of 0.8 $\mu$m thickness, followed by growth of n type GaN light guide layer 205 (Si impurity concentration: $1 \times 10^{18}/cm^3$) to a thickness of 0.1 $\mu$m. Thereafter, the substrate temperature is lowered to 800° C., and light emitting layer 206 is formed as a multiple quantum well structure having a plurality of 8 nm thick $In_{0.05}Ga_{0.95}N$ barrier layers and a plurality of 4 nm thick $GaN_{0.97}P_{0.03}$ well layers alternately stacked. In the present embodiment, light emitting layer 206 has a multiple quantum well structure starting and ending with barrier layers and includes three quantum well layers (three cycles). $SiH_4$ (Si impurity concentration: $1 \times 10^{18}/cm^3$) is added during growth of both the barrier and well layers. A growth break interval of at least one second and at most 180 seconds may be provided between growth of the barrier layer and growth of the well layer, or between growth of the well layer and the growth of barrier layer. This can increase flatness of the barrier and well layers, and also decrease the half-width of emission peak.

The composition ratio of As, P or Sb in the well layer can be adjusted in accordance with an intended wavelength of light to be emitted. For example, ultraviolet light with a wavelength in the vicinity of 380 mm can be obtained with x=0.005 in the case of $GaN_{1-x}As_x$, y=0.01 in the case of $GaN_{1-y}P_y$, and z=0.002 in the case of $GaN_{1-z}Sb_z$. Violet light with a wavelength in the vicinity of 410 nm is obtained with x=0.02 in the case of $GaN_{1-x}As_x$m y=0.03 in the case of $GaN_{1-y}P_y$, and z=0.01 in the case of $GaN_{1-z}Sb_z$. Further, blue light with a wavelength in the vicinity of 470 nm is obtained with x=0.03 in the case of $GaN_{1-x}As_x$, y=0.06 in the case of $GaN_{1-y}P_y$, and z=0.02 in the case of $GaN_{1-z}Sb_z$. Furthermore, green light with a wavelength in the vicinity of 520 nm is obtained with x=0.05 in the case of $GaN_{1-x}As_x$, y=0.08 in the case of $GaN_{1-y}P_y$, and z=0.03 in the case of $GaN_{1-z}Sb_z$. Still further, red light with a wavelength in the vicinity of 650 nm is obtained with x=0.07 in the case of $GaN_{1-x}As_x$, y=0.12 in the case of $GaN_{1-y}P_y$, and z=0.04 in the case of $GaN_{1-z}Sb_z$.

Next, the substrate temperature is raised to 1050° C. again, and p type $Al_{0.2}Ga_{0.8}N$ carrier block layer 207 of 20 nm thickness, p type GaN light guide layer 208 of 0.1 $\mu$m thickness, p type $Al_{0.1}Ga_{0.9}N$ clad layer 209 of 0.5 $\mu$m thickness, and p type GaN contact layer 210 of 0.1 $\mu$m thickness are grown. As the p type impurity, Mg ($EtCP_2Mg$) is added at a concentration of $5 \times 10^{19}/cm^3$ to $2 \times 10^{20}/cm^3$. The p type impurity concentration in p type GaN contact layer 210 is preferably increased as it approaches the interface with p type electrode 212. This can decrease the contact resistance with formation of the p electrode. In addition, oxygen of a minute amount may be added during growth of the p type layers to remove residual hydrogen that hinder activation of Mg as the p type impurity.

After the growth of p type GaN contact layer 210, the entire gas in the reactive chamber of the MOCVD system is replaced with nitrogen gas and $NH_3$, and the temperature is decreased at a cooling rate of 60° C./min. At the time when the substrate temperature reaches 800° C., supply of $NH_3$ is stopped. The substrate temperature is held at 800° C. for five minutes, and then lowered to the room temperature. As such, the substrate is temporarily held at a temperature preferably in a range from 650° C. to 900° C., for a time period preferably in a range from 3 minutes to 10 minutes. The temperature is then lowered to the room temperature preferably at a rate of more than 30° C./min. The surface of the film thus grown was evaluated by Raman spectroscopy, and it was found that the film already had p type characteristics (i.e., Mg was already activated) immediately after its growth, though conventional annealing to make nitride semiconductor films have such p type characteristics was not carried out yet. On formation of the p type electrode, the contact resistance was also already reduced. If the conventional annealing to give p type characteristics is additionally applied, the activation ratio of Mg will further improve.

Low-temperature GaN buffer layer 201 may be replaced with a low-temperature $Al_xGa_{1-x}N$ buffer layer ($0 \leq x \leq 1$), or it may be omitted. With a GaN substrate commercially available at the present, however, it is preferable to insert low-temperature $Al_xGa_{1-x}N$ buffer layer ($0 \leq x \leq 1$), to improve the unfavorable surface morphology of the GaN substrate. Here, the low-temperature buffer layer refers to a buffer layer formed at a relatively low growth temperature of about 450° C. to about 600° C. The buffer layer made at a growth temperature in this range becomes polycrystalline or amorphous.

$In_{0.07}Ga_{0.93}N$ anti-crack layer 203 may have the In composition ratio of other than 0.07, or the layer itself may be omitted. However, the InGaN anti-crack layer is preferably inserted when lattice mismatch between the clad layer and the GaN substrate is large.

Although the light emitting layer of the present embodiment has the configuration starting and ending both with the barrier layers (FIG. 4A), it may have a configuration starting and ending both with the well layers (FIG. 4B). The number of well layers in the light emitting layer is not limited to 3 as described above. The threshold current density is sufficiently low with at most 10 well layers, enabling continuous lasing at the room temperature. In particular, the well layers of at least 2 and at most 6 are preferable, ensuring the low threshold current density (FIG. 26).

While Si has been added in both the well and barrier layers at concentration of $1 \times 10^{18}/cm^3$ in the light emitting layer of the eleventh embodiment, it may be added in only one or even none of the layers. This is because that the defect density in the light emitting layer is reduced in the case of using the nitride semiconductor substrate and thus there is a probability that undesirable increase of light absorption (gain loss) due to the impurity in the light emitting layer becomes more significant as compared to improvement of crystallinity due to the impurity. When the impurity is added in the light emitting layer grown on a nitride semiconductor substrate, it is preferably added in the order of $1 \times 10^{16}/cm^3$ to $1 \times 10^{19}/cm^3$, and any of O, S, C, Ge, Zn, Cd and Mg, besides Si, may be employed preferably.

P type $Al_{0.2}Ga_{0.8}N$ carrier block layer 207 may have the Al composition ratio of other than 0.2, or the layer itself may be omitted. The threshold current density, however, was lowered with provision of the carrier block layer, presumably because of its function to confine the carriers in the light emitting layer. The Al composition ratio of the carrier block layer is preferably set high to increase the carrier confining effect. When the Al composition ratio is set small within a range maintaining the carrier confinement, mobility of the carriers in the carrier block layer increases, thereby decreasing the electric resistance favorably. Further, because of inclusion of Al, carrier block layer 207 serves to prevent In and As, P or Sb in the light emitting layer from escaping out of the crystal.

Although $Al_{0.1}Ga_{0.9}N$ crystals have been employed for the p type clad layer and the n type clad layer in the present embodiment, they may each be a ternary system of AlGaN having an Al composition ratio of other than 0.1. If the Al composition ratio in the mixed crystal is increased, the energy gap difference as well as the refractive index difference with the light emitting layer increase, so that carriers and light can be confined in the light emitting layer efficiently, leading to reduction of the lasing threshold current density. Further, if the Al composition ratio is lowered within the range maintaining confinement of carriers and light, mobility of the carriers in the clad layer increases, so that operating voltage of the laser device can be reduced.

Preferably, the AlGaN clad layer has a thickness of 0.7–1.0 $\mu$m. This ensures a unimodal vertical transverse mode and increases the light confining effect, and further enables improvement in optical characteristics of the laser and reduction of the laser threshold current density.

The clad layer is not limited to the ternary system mixed crystal of AlGaN, but it may be a quaternary system mixed crystal of AlInGaN, AlGaNP, or AlGaNAs. Further, the p type clad layer may have a super-lattice structure formed of p type AlGaN layer and p type GaN layer or a super-lattice structure formed of p type AlGaN layer and p type InGaN layer for the purpose of reducing electric resistance.

Although the C-plane {0001} substrate of GaN substrate has been explained in the eleventh embodiment, A-plane {11-20}, R-plane {1-102}, M-plane {1-100} or {1-101} plane may be employed as the plane orientation of the main surface of the substrate. A substrate having an off-angle of at most two degrees from any of these plane orientations causes good surface morphology. A nitride semiconductor substrate other than the GaN substrate may also be employed in the present embodiment. In the case of a nitride semiconductor laser, a layer having a lower refractive index than that of a clad layer is preferably provided to contact the outside of the clad layer to obtain a unimodal vertical transverse mode, and thus an AlGaN substrate can suitably be used.

In the present embodiment, the crystal growth using the MOCVD system has been explained. Alternatively, molecular beam epitaxy (MBE) or hydride vapor phase epitaxy (HVPE) may be utilized.

(Working Process)

Explanation is now given regarding the working process of the epi-wafer formed by the "crystal growth" as described above and taken out of the MOCVD system to obtain laser chips.

Hf and Au are deposited in this order on the back side of n type GaN substrate 200, to form n electrode 211. Ti/Al, Ti/Mo, Hf/Al or the like may also be used as the materials for the n electrode. Hf is preferably used to decrease the contact resistance of the n electrode.

The p electrode portion is etched in a stripe manner along a <1-100>direction of the GaN substrate to form a ridge stripe portion (FIG. 16). The ridge stripe portion is formed to have a stripe width of 2 $\mu$m. Thereafter, $SiO_2$ dielectric film 213 is formed by evaporation, p type GaN contact layer 210 is exposed, and Pd, Mo and Au are vapor-deposited in this order to form p electrode 212. Pd/Pt/Au, Pd/Au or Ni/Au may also be used as the materials for the p electrode.

Lastly, Fabri-Perot resonators of 500 $\mu$m each in length are formed utilizing the cleavage plane of the GaN substrate. In general, the resonator length is preferably in a range of from 300 $\mu$m to 1000 $\mu$m. The mirror end surfaces of each resonator is formed parallel to the M plane ({1-100} plane) of the GaN substrate (see FIG. 2). Cleavage for formation of the mirror end surfaces and division into laser chips are carried out with a scriber on the substrate side. The cleavage for forming the mirror end surfaces is done with the scriber, by scratching not the entire wafer surface but only portions of the wafer, e.g., only the both ends of the wafer. This prevents degradation of sharpness of the end surfaces and also prevents shavings due to the scribing from attaching to the epi-surface, thereby increasing the yield. As the feedback method of the laser resonator, DFB or DBR commonly known may also be employed instead of the Fabri-Perot type. After formation of the mirror end surfaces of the Fabri-Perot resonator, dielectric films of $SiO_2$ and $TiO_2$ are alternately formed on one of the mirror end surfaces by evaporation, to make a dielectric multilayer reflection film having a refractive index of 70%. Alternatively, $SiO_2/Al_2O_3$ may also be employed for the dielectric multilayer reflection film. Further, although n electrode 111 has been formed on the back side of n type GaN substrate 200 in this embodiment, alternatively a portion of n type GaN layer 202 may be exposed from the front side of the epi-wafer by dry etching, to form the n electrode thereon (see FIG. 18).

(Packaging)

The method of packaging the semiconductor laser chip is now explained. In the case of using the nitride semiconductor laser chip as a high output laser (of at least 30 mW), the chip is connected to a package body using an In soldering material, preferably with the semiconductor junction facing down. Alternatively, the nitride semiconductor laser chip may be connected via a sub-mount of Si, AlN, diamond, Mo, CuW, BN, Au, SiC, Cu or Fe, instead of being directly attached to the package body or a heat sink portion.

The well layer of the eleventh embodiment contains As, P or Sb. Inclusion of such an element in the well layer serves to reduce the effective mass of electrons and holes in the well layer and increase mobility of the electrons and the holes. The former effect means that carrier population inversion for lasing is attained with a less introduced amount of current. The latter effect means that, even when the electrons and the holes disappear by luminous recombination in the light emitting layer, additional electrons and holes can rapidly be introduced by diffusion. That is, it will be possible to obtain a semiconductor laser excellent in self-oscillating characteristics (excellent in noise characteristics) having a less threshold current density compared to the conventional InGaN-based nitride semiconductor laser device having the well layer unprovided with As, P or Sb. With the conventional nitride semiconductor laser device having the well layer not containing As, P or Sb, the above-described advantages would not be obtained sufficiently, because of the impaired steepness at the interface between the well and barrier layers.

In the eleventh embodiment, the interfacial steepness in the light emitting layer has been improved by including In in the nitride semiconductor barrier layer in contact with the $GaN_{1-x-y-z}As_xP_ySb_z$ well layer (0<x+y+z<0.3), thereby enabling formation of the multiple quantum well structure. Further, it becomes possible to form a semiconductor laser having a low threshold current density, with high output and long life accompanying thereto, and also having excellent noise characteristics. For example, if a nitride semiconductor laser of blue color (a wavelength of 380–420 nm) is formed according to the present embodiment, it is possible to obtain a semiconductor laser low in lasing threshold current density and resistant to noise as compared to a conventional InGaN-based nitride semiconductor laser. Such a laser device can stably operate at high output (50 mW) in a high-temperature atmosphere and thus it can be suitably used in a high-density recording/reproducing optical disk device.

Twelfth Embodiment

Figure 17A:
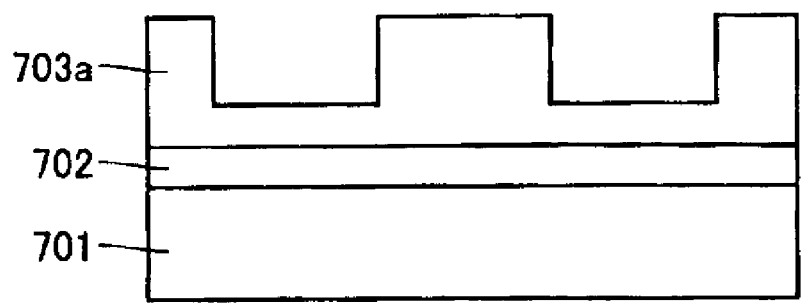
FIG. 17A is a schematic cross sectional view showing an etching step for forming a pseudo GaN substrate.
Figure 17B:
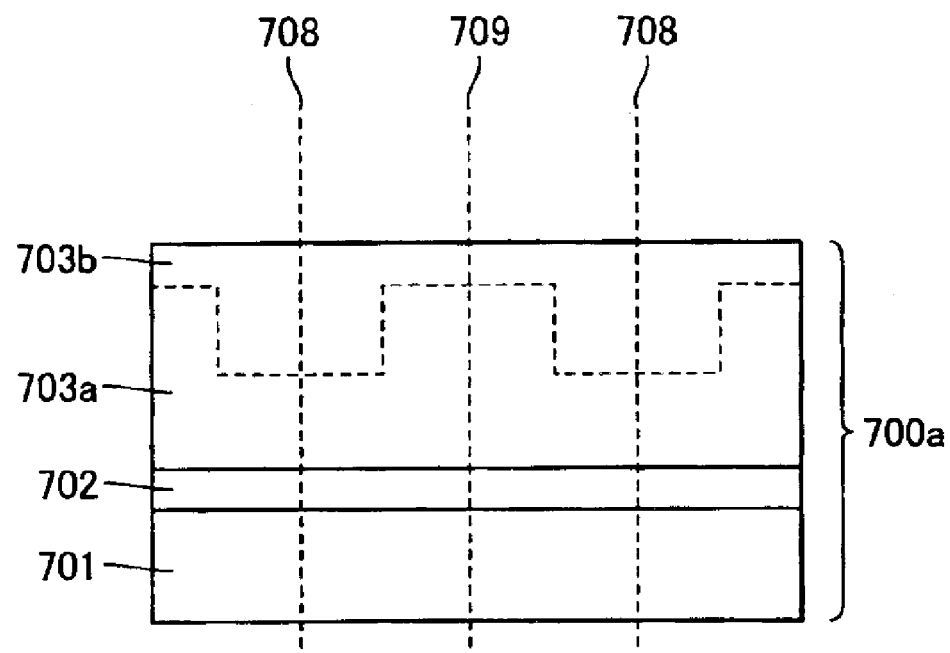
FIG. 17B is a schematic cross sectional view showing the pseudo GaN substrate completed.
Figure 18:
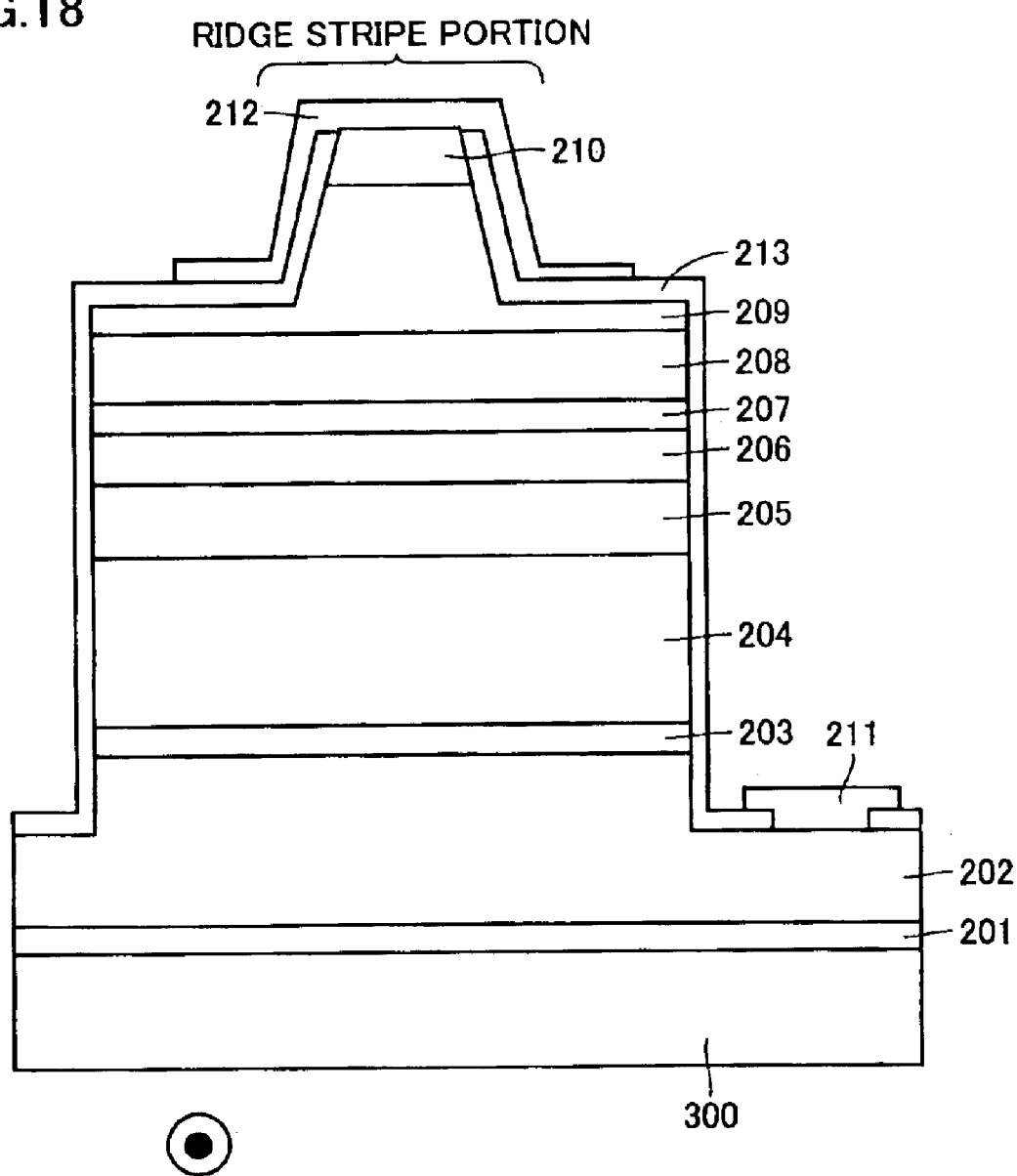
FIG. 18 is a schematic cross sectional view showing a structure of a nitride semiconductor laser device according to still another embodiment.

The twelfth embodiment is similar to the eleventh embodiment except that GaN substrate 200 of FIG. 16 is replaced with pseudo GaN substrate 1400 of FIG. 14 or pseudo GaN substrate 700a of FIG. 17B, and that p type and n type electrodes are formed on one side of the substrate as shown in FIG. 18.

The pseudo GaN substrate 1400 in FIG. 14 includes a seed substrate 1401, a low-temperature buffer layer 1402, an n type GaN film 1403, a growth inhibiting film 1404, and an n type GaN thick film 1405. That is, pseudo GaN substrate 1400 has seed substrate 1401 which is used as a base material for growing n type GaN thick film 1405. The growth inhibiting film is for restricting crystal growth of the nitride semiconductor film. The pseudo GaN substrate described here refers not only to the one having a configuration as shown in FIG. 14, but also to any other one including at least a seed substrate and a growth inhibiting film.

The pseudo GaN substrate 700a shown in FIG. 17B includes a seed substrate 701, a low-temperature buffer layer 702, a first n type GaN film 703a, and a second n type GaN film 703b. Here, FIG. 17A shows a step in the course of formation of pseudo GaN substrate 700a.

During formation of pseudo GaN substrate 700a, after first n type GaN film 703a is laminated, the surface of the GaN film 703a is shaped to have grooves by dry etching or wet etching, as shown in FIG. 17A. Thereafter, second n type GaN film 703b is laminated again in the crystal growth system, to complete pseudo GaN substrate 700a (FIG. 17B). Although the grooves have been formed only to a depth in the middle of first n type GaN film 703a in FIG. 17A, they may be formed to reach into low-temperature buffer layer 702 or into seed substrate 701.

When a nitride semiconductor film was grown on pseudo GaN substrate 1400 or 700a formed as described above, its defect density (etch pit density: less than about $7 \times 10^7 / cm^2$) was lower than in the case of forming the film on a sapphire substrate or a SiC substrate (etch pit density: more than about $4 \times 10^8 / cm^2$). In FIG. 14, parts of the low defect density are observed in regions except on a line 1411 defining the center in width of a growth inhibiting film and a line 1410 defining the center in width of the portion unprovided with the growth inhibiting film. In FIG. 17B, they correspond to regions except on a line 708 immediately at the center in width of a groove and a line 709 defining the center in width of a portion (hill) unprovided with the groove. In other words, the defect density is low in the vicinity of the middle portion between lines 1411 and 1410 in FIG. 14 and in the vicinity of the middle portion between lines 708 and 709 in FIG. 17B, while it is high in the portions on lines 1411, 1410, 708 and 709. Accordingly, a light emitting device can be formed on the pseudo GaN substrate in a region having the low defect density.

Specific examples of seed substrate 701 include C-plane sapphire, M-plane sapphire, A-plane sapphire, R-plane sapphire, GaAs, ZnO, MgO, spinel, Ge, Si, GaN, 6H—SiC, 4H—SiC and 3C—SiC. Specific examples of growth inhibiting film 204 include dielectric films such as $SiO_2$ film, $SiN_x$ film, $TiO_2$ film and $Al_2O_3$ film, and metal films such as tungsten film. Further, a hollow portion may be formed on growth inhibiting film 1404 shown in FIG. 14. Provision of the hollow portion in n type GaN thick film 1405 alleviates crystal strain above the hollow portion, and, as a result, can contribute to improvement in luminous efficiency of the light emitting device.

When a conductive SiC or Si substrate is used as the seed substrate, the n electrode, may be formed on the back side of the substrate, as shown in FIG. 16. In such a case, however, low-temperature buffer layer 702 should be replaced with a high-temperature buffer layer. Here, the high-temperature buffer layer refers to a buffer layer formed at a growth temperature of at least 700° C. The high-temperature buffer layer needs to contain Al; otherwise, it is impossible to form a nitride semiconductor film having good crystallinity over the SiC or Si substrate. The most preferable material for the high-temperature buffer layer is InAlN.

Preferably, the plane orientation of the main surface of the seed substrate (in the case of hexagonal system) is C-plane {0001}, A-plane {11-20}, R-plane {1-102}, M-plane {1-100} or {1-101} plane. Any substrate having an off-angle within two degrees from any of these plane orientations enables good surface morphology.

A nitride semiconductor light emitting device (laser diode) using the pseudo GaN substrate is now explained. The laser device in FIG. 18 includes a substrate 300, a low-temperature GaN buffer layer 201, an n type GaN layer 202, an n type $In_{0.07}Ga_{0.93}N$ anti-crack layer 203, an n type $Al_{0.1}Ga_{0.9}N$ clad layer 204, an n type GaN light guide layer 205, a light emitting layer 206, a p type $Al_{0.2}Ga_{0.8}N$ carrier block layer 207, a p type GaN light guide layer 208, a p type $Al_{0.1}Ga_{0.9}N$ clad layer 209, a p type GaN contact layer 210, an n electrode 211, a p electrode 212, and a $SiO_2$ dielectric film 213. The pseudo GaN substrate as described above is used as substrate 300 of the twelfth embodiment. The specific method of forming this laser diode is similar as described above in the eleventh embodiment, though packaging as will be described below in the thirteenth embodiment is preferable when the seed substrate is, e.g., of sapphire poor in heat conductivity. The laser diode has a ridge stripe portion as shown in FIG. 18 that is formed avoiding at least regions corresponding to lines 1411 and 1410 in FIG. 14 or lines 708 and 709 in FIG. 17B.

Low-temperature GaN buffer layer 201 in the twelfth embodiment may be a low-temperature $Al_xGa_{1-x}N$ buffer layer (0≦x≦1), or the layer itself may be omitted. If the pseudo GaN substrate has poor surface morphology, however, it is preferable to insert the low-temperature $Al_xGa_{1-x}N$ buffer layer (0≦x≦1) to improve the surface morphology. The laser diode may be formed after removing seed substrate 701 from substrate 300 by a polishing machine. Alternatively, the laser diode may be formed after low-temperature buffer layer 701 and all the layers thereunder are removed from substrate 300 by a polishing machine. Further, the laser diode may be formed after removing growth inhibiting film 704 and all the layers thereunder from substrate 300 by a polishing machine. In the case that seed substrate 701 is removed, n electrode 211 may be formed on the plane from which the seed substrate has been removed. Still further, seed substrate 701 may be removed after the laser diode is formed.

Thirteenth Embodiment

The thirteenth embodiment is similar to the eleventh embodiment except that a C-plane (0001) sapphire substrate is employed as the substrate 300 in FIG. 18. In packaging this nitride semiconductor laser chip, the chip may be connected to the package body using an In soldering material, with the semiconductor junction facing down, since the sapphire substrate is low in heat conductivity. Alternatively, the chip may be connected via a sub-mount of Si, AlN, diamond, Mo, CuW, BN, Au, SiC, Cu or Fe, instead of being directly attached to the package body or a heat sink portion. In the case that the substrate other than the nitride semiconductor is formed of a material such as SiC or Si having high heat conductivity, the chip may also be connected to the package with the semiconductor junction facing up.

Although the sapphire substrate has been explained in the thirteenth embodiment, 6H—SiC, 4H—SiC, 3C—SiC, Si or spinel ($MgAl_2O_4$) may be employed for the substrate. Since the SiC substrate and the Si substrate are conductive, the n electrode may be formed on the back side of either of those substrate, as shown in FIG. 16. Further, the buffer layer for growing a nitride semiconductor film of good crystallinity over the SiC or Si substrate is a high-temperature buffer layer similarly as in the twelfth embodiment.

Although the C-plane {0001} substrate has been explained in the present embodiment, the plane orientation of the main surface of the substrate may be A-plane {11-20}, R plane {1-102}, M-plane {1-100} or {1-101} plane. Further, a substrate having an off-angle within two degrees from any of these plane orientations enables good surface morphology.

Fourteenth Embodiment

In the fourteenth embodiment, the light emitting layer in the eleventh embodiment is applied to a nitride semiconductor light emitting diode device. The light emitting diode device of the present embodiment shown in FIG. 19 includes an n type GaN substrate 600 having a C-plane (0001), a low-temperature GaN buffer layer 601 (thickness: 100 nm), an n type GaN layer 602 (thickness: 3 $\mu$m, Si impurity concentration: $1\times10^{18}/cm^3$), a light emitting layer 603 (e.g., five-cycle $GaN_{0.97}As_{0.03}$ well layers/$In_{0.05}Ga_{0.95}N$ barrier layers), a p type $Al_{0.1}Ga_{0.9}N$ carrier block layer 604 (thickness: 20 nm, Mg impurity concentration: $6\times10^{19}/cm^3$), a p type GaN contact layer 605 (thickness: 0.1 $\mu$m, Mg impurity concentration: $1\times10^{20}/cm^3$), a transparent electrode 606, a p electrode 607, and an n electrode 608.

Figure 20:
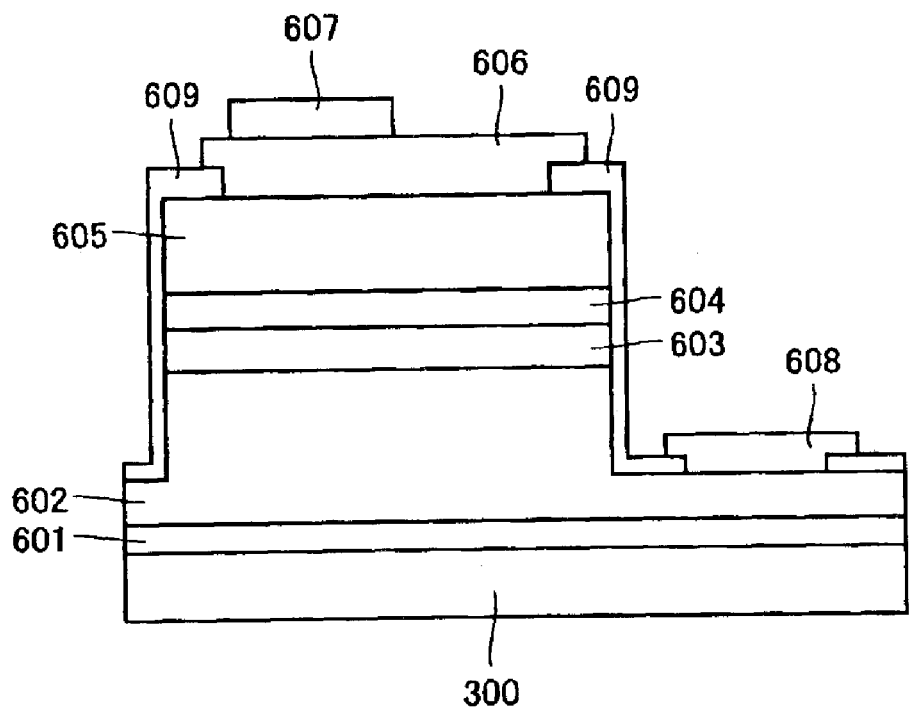
FIG. 20 is a schematic cross sectional view showing another example of the light emitting diode device of still anothr embodiment.

In the present embodiment, n electrode 608 is formed by laminating Hf and Au in this order on the back side of n type GaN substrate 600. Ti/Al, Ti/Mo or Hf/Al may also be used as the materials of the n electrode. Use of Hf in the n electrode is particularly preferable, since it reduces the contact resistance of the n electrode. Although n electrode 608 has been formed on the back side of n type GaN substrate 600, a portion of n type GaN layer 602 may be exposed by dry etching as shown in FIG. 20, and the n electrode may be formed on the exposed portion.

In forming the p electrode, Pd as transparent electrode 606 is formed by evaporation to a thickness of 7 nm, and Au as p electrode 607 is also formed by evaporation. Alternatively, the transparent electrode may be formed of Ni, Pd/Mo, Pd/Pt, Pd/Au, Ni/Au or the like.

Lastly, a scriber is used to divide n type GaN substrate 600 into chips from the back side (opposite to the surface on which transparent electrode 606 is deposited). Scribing is carried out from the back side of the substrate to prevent shavings after scribing from attaching to the transparent electrode side from which light is taken out. Scribing is carried out for chip division in such a direction that at least one side includes the cleavage surface of the nitride semiconductor substrate. This prevents abnormality in chip shape due to chipping or cracking, and improves the yield of chips per wafer.

The GaN substrate 600 may be replaced with the pseudo GaN substrate explained in the twelfth embodiment. The nitride semiconductor light emitting diode device grown on the pseudo GaN substrate has exhibited approximately the same characteristics as that grown on the GaN substrate (see FIG. 27). The yield of the light emitting devices is liable to decrease in the case of using the pseudo GaN substrate compared to the case of using the GaN substrate, since the pseudo GaN substrate includes the regions of low defect density and of high defect density in a mixed state. On the other hand, the pseudo GaN substrate is advantageous in that it is less expensive than the nitride semiconductor substrate and thus the one of a large area can be obtained. When the pseudo GaN substrate has an insulative seed substrate, the n electrode and the p electrode may be formed on the same side of the substrate, as shown in FIG. 20.

Figure 19:
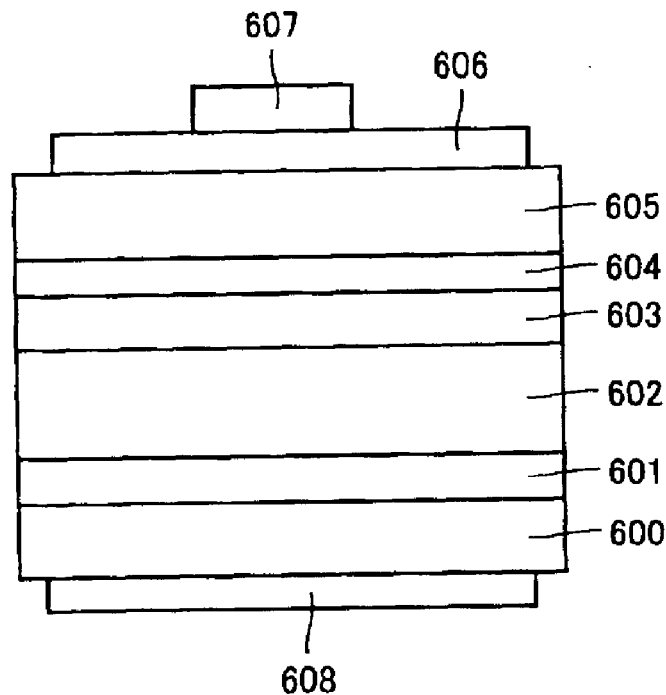
FIG. 19 is a schematic cross sectional view showing a light emitting diode device according to still another embodiment.

The nitride semiconductor light emitting diode device may be formed on a substrate other than the nitride semiconductor, with a nitride semiconductor buffer layer interposed therebetween. As a specific example thereof, the nitride semiconductor light emitting diode device shown in FIG. 20 includes a substrate 300, a low-temperature GaN buffer layer 601 (thickness: 25 nm), an n type GaN layer 602 (thickness: 3 $\mu$m, Si impurity concentration: $1\times10^{18}/cm^3$), a light emitting layer 603 (e.g., five-cycle $GaN_{0.97}P_{0.03}$ well layers/$In_{0.05}Ga_{0.95}N$ barrier layers), a p type $Al_{0.1}Ga_{0.9}N$ carrier block layer 604 (thickness: 20 nm, Mg impurity concentration: $6\times10^{19}/cm^3$), a p type GaN contact layer 605 (thickness: 0.1 $\mu$m, Mg impurity concentration: $1\times10^{20}/cm^3$), a transparent electrode 606, a p electrode 607, an n electrode 608, and a dielectric film 609. Here, a sapphire substrate is used as the substrate 300. When substrate 300 is a conductive SiC or Si substrate, the n electrode and the p electrode may be formed on respective sides of the substrate, as shown in FIG. 19. The buffer layer for enabling growth of a nitride semiconductor film of good crystallinity on the SiC or Si substrate is a high-temperature buffer layer similarly as in the twelfth embodiment.

Fifteenth Embodiment

The fifteenth embodiment is similar to the eleventh embodiment except that the light emitting layer of the eleventh embodiment is applied to a nitride semiconductor super-luminescent diode device. As to the luminous intensity of this light emitting device, approximately the same effect as in the light emitting diode device can be obtained (see FIG. 27).

Sixteenth Embodiment

In the sixteenth embodiment, an optical device is formed including the nitride semiconductor laser as in the above embodiments. An optical device using, e.g., a nitride semiconductor laser of violet color (wavelengths of 380–410 nm) according to the present invention exhibits a low lasing threshold current density compared to a conventional nitride semiconductor laser and can operate stably at high output (50 mW) in a high temperature atmosphere. Thus, it is suitably applicable to a recording/reproducing optical device for a high-density recording/reproducing optical disk.

Figure 21:
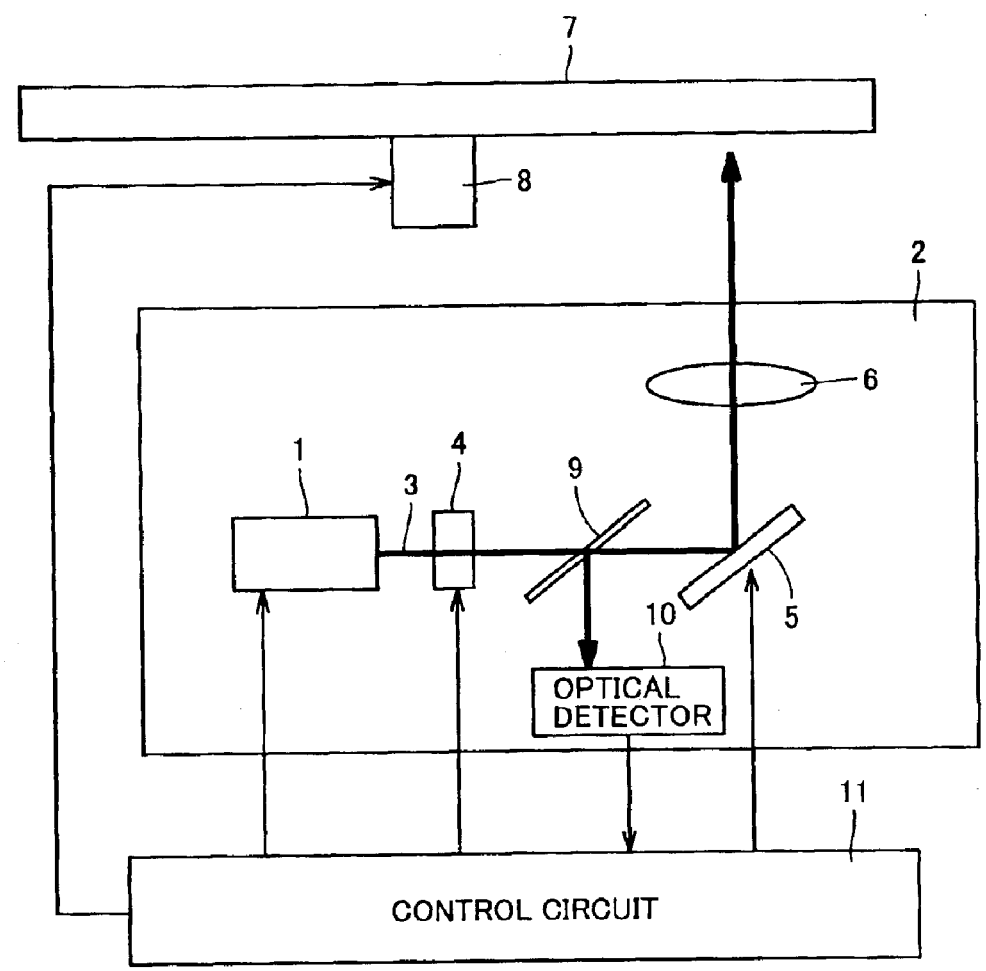
FIG. 21 is a schematic block diagram showing an optical disk recording/reproducing device as an example of the optical device in which the light emitting device of the present invention is employed.

FIG. 21 is a schematic block diagram of the optical disk information recording/reproducing device including an optical pick-up device 2, as an example of the optical device including the laser device 1 of the present invention. In this optical information recording/reproducing device, laser light 3 is modulated by an optical modulator 4 in accordance with input information, and is recorded on a disk 7 via a scanning mirror 5 and a lens 6. Disk 7 is rotated by a motor 8. At the time of reproduction, reflected laser light optically modulated by the pit arrangement on disk 7 is detected by a detector 10 via a beam splitter 9, to obtain a reproduction signal. The operations of the respective elements are controlled by a control circuit 11. Laser device 1 usually has an output of 30 mW at the time of recording and an output of about 5 mW at the time of reproduction.

The laser device according to the present invention is not only applicable to the optical disk recording/reproducing device as described above, but also applicable to a laser printer or a projector including laser diodes of optical three primary colors (blue, green and red).

Seventeenth Embodiment

In the seventeenth embodiment, the nitride semiconductor light emitting diode as the above embodiments is used for an optical device. As an example, it is possible to form a white light source including light emitting diodes or superluminescent diodes of optical three primary colors (red, green, blue) utilizing the light emitting layer of the present invention, and also form a display employing those three primary colors. Alternatively, a white light source device can also be obtained by applying fluorescent coating to the light emitting diode of the present invention having an emission wavelength of 360–430 nm.

When a white light source utilizing the light emitting device of the present invention is employed instead of a halogen light source conventionally used for a liquid crystal display, a backlight of high luminance can be obtained consuming less power. That is, the white light source including the light emitting device of the present invention may be utilized as a backlight for liquid crystal display of a man-machine interface in a portable note computer, a portable telephone or the like, to realize a compact and high definition liquid crystal display.

INDUSTRIAL APPLICABILITY

As described above, according to an aspect of the present invention, in a nitride semiconductor light emitting device including a light emitting layer having a multiple quantum well structure with quantum well layers and barrier layers laminated alternately, the quantum well layer is formed of a nitride semiconductor containing at least In and the barrier layer is formed containing As, P or Sb. Accordingly, phase separation in the well layer is suppressed and thus mottling in light emitted from the light emitting device is prevented and luminous efficiency is improved.

According to another aspect of the present invention, in a nitride semiconductor light emitting device having $GaN_{1-x-y-z}As_xP_ySb_z$ well layer ($0<x+y+z\leq 0.3$), In is included in a nitride semiconductor barrier layer in contact with the well layer. Accordingly, steepness of composition change at the interface between the well layer and the barrier layer is improved, and thus the luminous efficiency is improved.

What is claimed is:

1. A nitride semiconductor light emitting device formed on a substrate of a hexagonal crystal system,
   comprising a light emitting layer having a quantum well structure with quantum well layers and barrier layers laminated alternately, wherein
   one or more of said quantum well layers is formed of InGaN or InAlGaN, and
   one or more of said barrier layers is formed of a nitride semiconductor layer containing As,
   wherein a concentration of said As in each of said barrier layers is more than $1 \times 10^{18}/cm^3$, and said As is less than 20% of group V elements present in each of said barrier layers.

2. The nitride semiconductor light emitting device according to claim 1, wherein at least one of a first adjacent semiconductor layer in contact with a first one of main surfaces of said light emitting layer closer to said substrate and a second adjacent semiconductor layer in contact with a second one of the main surfaces of said light emitting layer farther from said substrate is formed of a nitride semiconductor containing Al.

3. The nitride semiconductor light emitting device according to claim 2, wherein one of said well layers is in direct contact with one of said first adjacent semiconductor layer and said second adjacent semiconductor layer.

4. The nitride semiconductor light emitting device according to claim 1, wherein said light emitting layer includes at least two and at most ten said well layers.

5. The nitride semiconductor light emitting device according to claim 1, wherein each of said well layers has a thickness of more than 0.4 nm and less than 20 nm.

6. The nitride semiconductor light emitting device according to claim 1, wherein each of said barrier layers has a thickness of more than 1 nm and less than 20 nm.

7. A nitride semiconductor light emitting device formed on a substrate of a hexagonal crystal system.
   comprising a light emitting layer having a quantum well structure with quantum well layers and barrier layers laminated alternately, wherein
   one or more of said quantum well layers is formed of InGaN or InAlGaN, and
   one or more of said barrier layers is formed of a nitride semiconductor layer containing P.
   wherein a concentration of said P in each of said barrier layers is more than $1 \times 10^{19}/cm^3$, and the P is less than 25% of group V elements present an each of said barrier layers.

8. A nitride semiconductor light emitting device formed on a substrate of a hexagonal crystal system,
   comprising a light emitting layer having a quantum well structure with quantum well layers and barrier layers laminated alternately, wherein
   one or more of said quantum well layers is formed of InGaN or InAlGaN, and
   one or more of said barrier layers is formed of a nitride semiconductor layer containing Sb,
   wherein a concentration of said Sb in each of said barrier layers is more than $1 \times 10^{17}/cm^3$, and the Sb is less than 15% of group V elements present in each of said barrier layers.

9. The nitride semiconductor light emitting device according to claim 1, wherein at least one of said well layers and said barrier layers contains at least one dopant selected from a group consisting of Si, O, S, C, Ge, Zn, Cd and Mg.

10. The nitride semiconductor light emitting device according to claim 9, wherein a concentration of said dopant is in a range of $1\times10^{16}/cm^3$ to $1\times10^{20}/cm^3$.

11. The nitride semiconductor light emitting device according to claim 1, wherein said substrate is formed of GaN.

12. An optical device including the nitride semiconductor light emitting device of claim 1.

13. A nitride semiconductor light emitting device formed on a substrate of a hexagonal crystal system, comprising a light emitting layer having a quantum well structure with quantum well layers and barrier layers laminated alternately, wherein
one or more of said well layers is formed of Ga $N_{1-x-y-z}As_xP_ySb_z$ ($0<x+y+z\leq0.3$), and
one or more of said barrier layers is formed of a nitride semiconductor layer having an In content of more than 0.1% and less than 15% of group III elements.

14. The nitride semiconductor light emitting device according to claim 13, wherein at least one of As, P and Sb is included in said one or more barrier layers.

15. The nitride semiconductor light emitting device according to claim 14, wherein a total of the As, P and Sb in said one or more of said barrier layers is more than $2\times10^{-5}$% and less than 20% of group V elements present in each of said barrier layers.

16. The nitride semiconductor light emitting device according to claim 14, wherein each of said barrier layers includes all constituent elements of said one or more well layers.

17. The nitride semiconductor light emitting device according to claim 13, wherein the number of said one or more well layers included in said light emitting layer is at least 2 and at most 10.

18. The nitride semiconductor light emitting device according to claim 13, wherein said substrate is formed of GaN.

19. The nitride semiconductor light emitting device according to claim 13, wherein each of said one or more well layers has a thickness of more than 3 nm and less than 20 nm, and each of said one or more barrier layers has a thickness of more than 3 nm and less than 20 nm.

20. The nitride semiconductor light emitting device according to claim 18, wherein each of said one or more well layers has a thickness of more than 0.4 nm and less than 20 nm, and each of said one or more barrier layers has a thickness of more than 1 nm and less than 20 nm.

21. The nitride semiconductor light emitting device according to claim 13, wherein at least one impurity selected from a group consisting of Si, O, S, Ge, Zn, Cd and Mg is added in said light emitting layer at a total concentration of more than $1\times10^{16}/cm^3$ and less than $1\times10^{20}/cm^3$.

22. An optical device including the nitride semiconductor light emitting device of claim 13.

23. The nitride semiconductor light emitting device according to claim 2, further comprising a nitride semiconductor layer containing Al in contact with one of main surfaces of said light emitting layer farther from said substrate, and a p type GaN layer in contact with said nitride semiconductor layer containing Al.

24. The nitride semiconductor light emitting device according to claim 2, further comprising a nitride semiconductor layer containing Al in contact with one of main surfaces of said light emitting layer closer to said substrate, and an n type GaN layer in contact with said nitride semiconductor layer containing Al.

25. A nitride semiconductor light emitting device formed on a substrate of a hexagonal crystal system, comprising a light emitting layer having a quantum well structure with quantum well layers and barrier layers laminated alternately, wherein
one or more of said quantum well layers is formed of InGaN or InAlGaN, and
one or more of said barrier layers is formed of a nitride semiconductor layer containing As, P or Sb,
further comprising a light guide layer formed of Ga $N_{1-x-y-z}As_xP_ySb_z$ ($0\leq x\leq0.075$, $0\leq y\leq0.1$, $0\leq z\leq0.025$, $0<x+y+z$), wherein said barrier layer has a bandgap energy smaller than that of said light guide layer.

26. A method of forming the nitride semiconductor light emitting device of claim 1, wherein a growth break interval of at least 1 second and at most 180 seconds is provided between crystal growth of said well layer and crystal growth of said barrier layer.

27. The nitride semiconductor light emitting device according to claim 13, further comprising a light guide layer, wherein said barrier layer has a bandgap energy smaller than that of said light guide layer.

28. The nitride semiconductor light emitting device according to claim 13, further comprising a nitride semiconductor layer containing Al, a p type GaN layer and a p type AlGaN layer formed in this order on a main surface of said light emitting layer farther from said substrate, wherein a first surface of said p type GaN layer contacts said nitride semiconductor layer containing Al, and wherein a second surface of said p type GaN layer contacts said p type AlGaN layer.

29. A method of forming the nitride semiconductor light emitting device according to claim 15, wherein a growth break interval of at least 1 second and at most 180 seconds is provided between crystal growth of said well layer and crystal growth of said barrier layer.

30. The nitride semiconductor light emitting device according to claim 7, wherein at least one of a first adjacent semiconductor layer in contact with a first one of main surfaces of said light emitting layer closer to said substrate and a second adjacent semiconductor layer in contact with a second one of the main surfaces of said light emitting layer farther from said substrate is formed of a nitride semiconductor containing Al.

31. An optical device including the nitride semiconductor light emitting device of claim 7.

32. The nitride semiconductor light emitting device according to claim 7, further comprising a light guide layer, wherein said light guide layer is formed of Ga $N_{1-x-y-z}As_xP_ySb_z$ ($0\leq x\leq0.075$, $0\leq y\leq0.1$, $0\leq z\leq0.025$, $0<x+y+z$).

33. A method of forming the nitride semiconductor light emitting device of claim 7, wherein a growth break interval of at least 1 second and at most 180 seconds is provided between crystal growth of said well layer and crystal growth of said barrier layer.

34. The nitride semiconductor light emitting device according to claim 8, wherein at least one of a first adjacent semiconductor layer in contact with a first one of main surfaces of said light emitting layer closer to said substrate and a second adjacent semiconductor layer in contact with a second one of the main surfaces of said light emitting layer farther from said substrate is formed of a nitride semiconductor containing Al.

35. An optical device including the nitride semiconductor light emitting device of claim 8.

36. The nitride semiconductor light emitting device according to claim 8, further comprising a light guide layer, wherein said light guide layer is formed of $GaN_{1-x-y-z}As_xP_ySb_z$ ($0 \leq x \leq 0.075$, $0 \leq y \leq 0.1$, $0 \leq z \leq 0.025$, $0 < x+y+z$).

37. A method of forming the nitride semiconductor light emitting device of claim 8, wherein a growth break interval of at least 1 second and at most 180 seconds is provided between crystal growth of said well layer and crystal growth of said barrier layer.

38. A method of forming a nitride semiconductor light emitting device formed on a substrate of a hexagonal crystal system, comprising a light emitting layer having a quantum well structure with quantum well layers and barrier layers laminated alternately, wherein one or more of said quantum well layers is formed of InGaN or InAlGaN, and one or more of said barrier layers is formed of a nitride semiconductor layer containing As, P or Sb, further comprising a light guide layer, wherein said barrier layer has a bandgap energy smaller than that of said light guide layer, wherein said method comprises growing a well layer and growing a barrier layer, and wherein a growth break interval of at least 1 second and at most 180 seconds is provided between crystal growth of said well layer and crystal growth of said barrier layer.

39. A nitride semiconductor light emitting device according to claim 1, wherein each of said quantum well layers of the light emitting layer is formed of InGaN or InAlGaN.

40. A nitride semiconductor light emitting device according to claim 1, wherein each of said barrier layers of the light emitting layer is formed of said nitride semiconductor layer containing As.

41. A nitride semiconductor light emitting device according to claim 7, wherein each of said quantum well layers of the light emitting layer is formed of InGaN or InAlGaN.

42. A nitride semiconductor light emitting device according to claim 7, wherein each of said barrier layers of the light emitting layer is formed of said nitride semiconductor layer containing P.

43. A nitride semiconductor light emitting device according to claim 8, wherein each of said quantum well layers of the light emitting layer is formed of InGaN or InAlGaN.

44. A nitride semiconductor light emitting device according to claim 8, wherein each of said barrier layers of the light emitting layer is formed of said nitride semiconductor layer containing Sb.

45. A nitride semiconductor light emitting device according to claim 13, wherein each of said well layers of the light emitting layer is formed of $GaN_{1-x-y-z}As_xP_ySb_z$ ($0 < x+y+z \leq 0.3$).

46. A nitride semiconductor light emitting device according to claim 13, wherein each of said barrier layers of the light emitting layer is formed of said nitride semiconductor layer having In.

* * * * *